United States Patent
BrightSky et al.

(10) Patent No.: US 9,627,612 B2
(45) Date of Patent: Apr. 18, 2017

(54) METAL NITRIDE KEYHOLE OR SPACER PHASE CHANGE MEMORY CELL STRUCTURES

(71) Applicant: INTERNATIONAL BUSINESS MACHINES CORPORATION, Armonk, NY (US)

(72) Inventors: Matthew Joseph BrightSky, Pound Ridge, NY (US); SangBum Kim, Yorktown Heights, NY (US); Chung Hon Lam, Peekskill, NY (US); Norma Edith Sosa Cortes, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/633,264

(22) Filed: Feb. 27, 2015

(65) Prior Publication Data
US 2015/0243884 A1    Aug. 27, 2015

Related U.S. Application Data

(60) Provisional application No. 61/945,287, filed on Feb. 27, 2014.

(51) Int. Cl.
*H01L 45/00*    (2006.01)

(52) U.S. Cl.
CPC .......... *H01L 45/06* (2013.01); *H01L 45/1233* (2013.01); *H01L 45/1246* (2013.01); *H01L 45/1253* (2013.01); *H01L 45/143* (2013.01); *H01L 45/144* (2013.01); *H01L 45/1683* (2013.01)

(58) Field of Classification Search
CPC ... H01L 45/06; H01L 45/1233; H01L 45/124; H01L 45/1246
See application file for complete search history.

(56) References Cited

U.S. PATENT DOCUMENTS

| 6,087,674 A * | 7/2000 | Ovshinsky ......... G11C 13/0004 |
|  |  | 257/2 |
| 7,317,201 B2 * | 1/2008 | Gutsche .................. H01L 45/06 |
|  |  | 257/2 |
| 7,615,459 B1 * | 11/2009 | Inoue .................. H01L 45/1226 |
|  |  | 438/385 |

(Continued)

FOREIGN PATENT DOCUMENTS

KR    20110044408 A  *  4/2011

*Primary Examiner* — Earl Taylor
(74) *Attorney, Agent, or Firm* — Scully, Scott, Murphy & Presser, P.C.; Louis J. Percello, Esq.

(57) ABSTRACT

Non-volatile memory cell having small programming power and a reduced resistance drift are provided. In one embodiment of the present application, a non-volatile memory cell is provided that includes a layer of dielectric material that has a via opening that exposes a surface of a bottom electrode. A metal nitride spacer is located along a bottom portion of each sidewall surface of the layer of dielectric material and in the via opening. A phase change material structure is present in the via opening and contacting a top portion of each sidewall surface of the layer of dielectric material and a topmost surface of each metal nitride spacer. A top electrode is located on a topmost surface of the phase change material structure.

10 Claims, 24 Drawing Sheets

(56) References Cited

U.S. PATENT DOCUMENTS

| | | | | |
|---|---|---|---|---|
| 7,638,359 B2* | 12/2009 | Lung | H01L 45/04 | 257/E21.086 |
| 7,943,420 B1* | 5/2011 | Breitwisch | H01L 27/2436 | 257/E21.067 |
| 8,178,405 B2* | 5/2012 | Lai | G11C 11/5678 | 257/2 |
| 8,283,650 B2* | 10/2012 | Breitwisch | H01L 27/2436 | 257/4 |
| 8,809,828 B2* | 8/2014 | Breitwisch | H01L 45/06 | 257/2 |
| 8,921,820 B2* | 12/2014 | BrightSky | H01L 45/16 | 257/1 |
| 8,946,073 B2* | 2/2015 | BrightSky | H01L 45/16 | 438/102 |
| 9,012,880 B2* | 4/2015 | Jang | H01L 45/1253 | 257/3 |
| 9,111,609 B2* | 8/2015 | Happ | G11C 13/0004 | |
| 9,166,161 B2* | 10/2015 | BrightSky | H01L 45/16 | |
| 9,373,785 B2* | 6/2016 | Kagawa | H01L 45/085 | |
| 2003/0001242 A1* | 1/2003 | Lowrey | H01L 23/525 | 257/646 |
| 2004/0234895 A1* | 11/2004 | Lee | H01L 45/06 | 430/311 |
| 2005/0215009 A1* | 9/2005 | Cho | H01L 45/06 | 438/257 |
| 2006/0125108 A1* | 6/2006 | Gutsche | H01L 45/06 | 257/774 |
| 2007/0097739 A1* | 5/2007 | Happ | H01L 45/06 | 365/163 |
| 2007/0117315 A1* | 5/2007 | Lai | H01L 45/04 | 438/257 |
| 2007/0152205 A1* | 7/2007 | Chen | H01L 27/2463 | 257/4 |
| 2007/0267618 A1* | 11/2007 | Zaidi | H01L 27/2463 | 257/2 |
| 2008/0054245 A1* | 3/2008 | Ahn | H01L 27/2463 | 257/3 |
| 2008/0138930 A1* | 6/2008 | Lung | H01L 45/04 | 438/102 |
| 2008/0164452 A1* | 7/2008 | Joseph | H01L 27/2436 | 257/3 |
| 2008/0191186 A1* | 8/2008 | Lung | H01L 45/1641 | 257/3 |
| 2008/0265239 A1* | 10/2008 | Philipp | H01L 45/06 | 257/4 |
| 2008/0272355 A1* | 11/2008 | Cho | H01L 27/2409 | 257/2 |
| 2008/0303014 A1* | 12/2008 | Goux | H01L 27/2445 | 257/3 |
| 2008/0308785 A1* | 12/2008 | Park | C23C 16/34 | 257/4 |
| 2009/0001337 A1* | 1/2009 | Furukawa | H01L 27/2454 | 257/2 |
| 2009/0050872 A1* | 2/2009 | Kuo | H01L 45/06 | 257/3 |
| 2009/0057643 A1* | 3/2009 | Chen | G11C 11/5678 | 257/4 |
| 2009/0095951 A1* | 4/2009 | Kostylev | H01L 45/06 | 257/4 |
| 2009/0127536 A1* | 5/2009 | Nirschl | B82Y 10/00 | 257/4 |
| 2009/0127537 A1* | 5/2009 | Jedema | H01L 27/2436 | 257/4 |
| 2009/0206316 A1* | 8/2009 | Weis | H01L 27/24 | 257/4 |
| 2009/0280599 A1* | 11/2009 | Im | H01L 45/06 | 438/102 |
| 2010/0096610 A1* | 4/2010 | Wang | H01L 27/2409 | 257/2 |
| 2010/0117046 A1* | 5/2010 | Chang | G11C 13/0004 | 257/3 |
| 2010/0117050 A1* | 5/2010 | Chen | H01L 27/24 | 257/4 |
| 2010/0127234 A1* | 5/2010 | Park | H01L 27/2409 | 257/4 |
| 2010/0155687 A1* | 6/2010 | Reyes | H01L 45/04 | 257/4 |
| 2010/0290277 A1* | 11/2010 | Happ | H01L 45/06 | 365/163 |
| 2010/0301480 A1* | 12/2010 | Choi | H01L 27/228 | 257/751 |
| 2010/0301988 A1* | 12/2010 | Czubatyj | G11C 13/0004 | 338/13 |
| 2011/0012079 A1* | 1/2011 | Chen | H01L 45/04 | 257/2 |
| 2012/0037877 A1* | 2/2012 | Breitwisch | H01L 45/06 | 257/3 |
| 2012/0063201 A1* | 3/2012 | Hayakawa | G11C 13/0007 | 365/148 |
| 2012/0068136 A1* | 3/2012 | Park | H01L 45/06 | 257/1 |
| 2012/0267601 A1* | 10/2012 | Lam | H01L 45/06 | 257/5 |
| 2012/0309159 A1* | 12/2012 | Chen | H01L 45/06 | 438/381 |
| 2013/0001499 A1* | 1/2013 | Breitwisch | H01L 45/06 | 257/3 |
| 2013/0087756 A1* | 4/2013 | Joseph | H01L 45/06 | 257/4 |
| 2013/0099188 A1* | 4/2013 | Kim | H01L 45/06 | 257/2 |
| 2014/0158971 A1* | 6/2014 | Lam | H01L 45/06 | 257/4 |
| 2014/0166962 A1* | 6/2014 | Brightsky | H01L 45/16 | 257/4 |
| 2014/0170831 A1* | 6/2014 | BrightSky | H01L 45/16 | 438/382 |
| 2014/0197368 A1* | 7/2014 | Yoneda | H01L 45/08 | 257/2 |
| 2015/0001459 A1* | 1/2015 | BrightSky | H01L 45/16 | 257/4 |
| 2015/0144859 A1* | 5/2015 | Chen | H01L 45/1253 | 257/4 |
| 2015/0243884 A1* | 8/2015 | BrightSky | H01L 45/06 | 257/4 |

* cited by examiner ically relates to semiconductor memory cells and methods of forming the same. More particularly, the present application relates to non-volatile phase change memory cells and methods of forming such cells.

METAL NITRIDE KEYHOLE OR SPACER PHASE CHANGE MEMORY CELL STRUCTURES

RELATED APPLICATIONS

This application claims benefit of U.S. Provisional Application Ser. No. 61/945,287, filed Feb. 27, 2014, the entire content of which is incorporated herein by reference.

BACKGROUND

The present application relates to semiconductor memory cells and methods of forming the same. More particularly, the present application relates to non-volatile phase change memory cells and methods of forming such cells.

Non-volatile memory and volatile memory are two major groups of computer memory. Constant input of energy is required to retain information in volatile memory devices, but not in non-volatile memory devices. Examples of non-volatile memory devices include Read Only Memory, Flash Electrical Erasable Read Only Memory, Ferroelectric Random Access Memory, Magnetic Random Access Memory and Phase Change Memory. Examples of volatile memory include Dynamic Random Access Memory (DRAM) and Static Random Access Memory (SRAM).

One type of non-volatile memory that has been growing in recent years is Phase Change Memory (PCM). In PCM, information is stored in materials that can be manipulated into different phases, e.g., the amorphous phase and the crystalline phase. Such materials are referred to as phase change materials. The amorphous phase and the crystalline phase are typically two phases used for bit storage (1's and 0's) since they have two detectable differences in electrical resistance. Notably, the amorphous phase has a higher resistance than the crystalline phase.

Glass chalcogenides are a group of materials commonly utilized as phase change materials. The aforementioned group of materials contains a chalcogen (i.e., an element from Group 16 of the Periodic Table of Elements) and a more electropositive element. Selenium (Se) and tellurium (Te) are the two most common semiconductors in the group used to produce a glass chalcogenide when creating a phase change memory cell. Examples of this include $Ge_2Sb_2Te_5$ (GST), SbTe, and $In_2Se_3$. However, some phase change materials do not utilize a chalcogen but still can be used in such memory cells. Thus, a variety of materials can be used in a PCM cell so long as the material can retain separate amorphous and crystalline states.

Some PCM cells may include a material stack of, from bottom to top, a bottom electrode, a phase change memory material and a top electrode. The phase change memory material is typically formed in a via opening that is provided in a dielectric material or dielectric material stack. In such PCM cells, some portion of the PCM cell, such as, for example, the via opening, is required to have a feature size that is smaller than what standard lithography can achieve in order to obtain reasonable small programming power. One known method to make a reduced size opening is to utilize a keyhole transfer process. Another known method is to use a spacer inside the via opening.

Resistance drift of the amorphous region of the phase change material is a reliability concern, especially for a multilevel cell (MLC) PCM. One method to mitigate this resistance drift is to include a metal nitride liner in the PCM cell so that the read current path utilizes the metal nitride material and bypasses the amorphous region of the phase change material.

Despite the above advances with PCM cells, there is a need to provide PCM cells in which small programming power is obtained, without the PCM cell exhibiting the resistance drift that is normally associated with prior art PCM cells.

SUMMARY

In one embodiment of the present application, a non-volatile memory cell is provided that includes a layer of dielectric material that has a via opening that exposes a surface of a bottom electrode. A metal nitride spacer is located along a bottom portion of each sidewall surface of the layer of dielectric material and in the via opening. A phase change material structure is present in the via opening. A top electrode is located on a topmost surface of the phase change material structure.

In another embodiment of the present application, a non-volatile memory cell is provided that includes a layer of dielectric material having a via opening that exposes a surface of a bottom electrode. A keyhole forming material spacer is located along an entirety of each sidewall surface of the layer of dielectric material and at a bottom of the via opening. A wrap around bottom electrode metal nitride contact is located in a bottom of the via opening and contacting a portion of the surface of the bottom electrode. A phase change material structure is present in the via opening. A top electrode is located on a topmost surface of the phase change material structure.

In yet another embodiment of the present application, a non-volatile memory cell is provided that includes a layer of dielectric material having a via opening that exposes a surface of a bottom electrode. A keyhole forming material spacer is located along an entirety of each sidewall surface of the layer of dielectric material and at a bottom of the via opening. A surfactant spacer is located on sidewall surfaces of each keyhole forming material spacer. A contiguous surfactant liner is located on sidewall surfaces of each surfactant spacer and on a portion of the surface of the bottom electrode not covered by the surfactant spacer. A phase change material structure is present in the via opening. A top electrode is located on a topmost surface of the phase change material structure.

In a further embodiment, a method of forming a non-volatile memory cell is provided that includes providing a structure including a via opening in a layer of dielectric material that exposes a surface of a bottom electrode. Next, a metal nitride spacer is formed along each sidewall surface of the layer of dielectric material and at a bottom of the via opening. A phase change material structure is formed within the via opening and a topmost surface of each metal nitride spacer. Next a top electrode is formed on a topmost surface of the phase change material structure.

In an even further embodiment of the present application, a method of forming a non-volatile memory cell is provided that includes providing a structure including a via opening in a layer of dielectric material that exposes a surface of a bottom electrode. Next, a keyhole forming material spacer is formed along an entirety of each sidewall surface of the layer of dielectric material and at a bottom of the via opening. A wrap around bottom electrode metal nitride contact is then formed in a bottom of the via opening and contacting a portion of the surface of the bottom electrode. Next, a phase change material structure is formed within the via opening, and a top electrode is formed on a topmost surface of the phase change material structure.

In still yet another embodiment of the present application, a method of forming a non-volatile memory cell is provided that includes providing a structure including a via opening in a layer of dielectric material that exposes a surface of a bottom electrode. Next, a keyhole forming material spacer is formed along an entirety of each sidewall surface of the layer of dielectric material and at a bottom of the via opening. A surfactant spacer is then formed on sidewall surfaces of each keyhole forming material spacer. Next, a contiguous surfactant liner is formed on sidewall surfaces of each surfactant spacer and on a portion of the surface of the bottom electrode not covered by the surfactant spacer. A phase change material structure is then formed within the via opening, and thereafter a top electrode is formed on a topmost surface of the phase change material structure.

DETAILED DESCRIPTION

Figure 1:
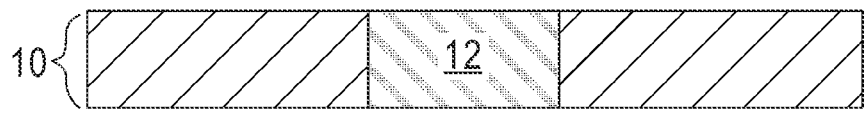
FIG. 1 is a cross sectional view of an exemplary semiconductor structure including a bottom electrode embedded in an insulating substrate in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

FIGS. 1-23 illustrate an embodiment of the present application in which a metal nitride material is ultimately formed into a metal nitride spacer within a via opening that is provided with a layer of dielectric material. The resistivity of the metal nitride material can be tuned (based on the dimensions of the structure) so that the resistance of the metal nitride material is approximately $1/(n-1)$ wherein n is equal to the levels being stored in the non-volatile memory cell, times the resistance of the phase change material when in the highest resistance level at time zero (this is the known optimal value of the metal nitride material in order to maximize the retention for MLC operation).

Referring first to FIG. 1, there is illustrated an exemplary semiconductor structure including a bottom electrode 12 embedded in an insulating substrate 10 in accordance with an embodiment of the present application. Although a single bottom electrode 12 is described and illustrated, a plurality of bottom electrodes may be formed into the insulating substrate 10. In some embodiments of the present application (as shown), the bottom electrode 12 extends through the entirety of the insulating substrate 10. In other embodiments, the bottom electrode 12 only partially extends through the insulating substrate 10.

The insulating substrate 10 may comprise any dielectric material including for example, silicon dioxide, silicon nitride, silicon oxynitride, silsesquioxanes, or C doped oxides (i.e., organosilicates) that include atoms of Si, C and H. In some embodiments, the dielectric material that provides insulating substrate 10 is non-porous. In other embodiments, the dielectric material that provides insulating substrate 10 is porous. In some embodiments, a single dielectric material can be used as the insulating substrate 10. In another embodiment, a plurality of dielectric materials may be used as the insulating substrate 10.

The insulating substrate 10 may be formed on a base substrate not shown. The base substrate may include a semiconductor material, an insulator material, and/or conductive material. The insulating substrate 10 can be formed utilizing a deposition process including, for example, chemical vapor deposition (CVD), plasma enhanced chemical vapor deposition (PECVD), spin-on coating, evaporation or chemical solution deposition. In one embodiment of the present application, the insulating substrate 10 has a thickness of 50 nm to 1000 nm. Thicknesses that are lesser than or greater than the aforementioned thickness range may also be employed for the thickness of the insulating substrate 10.

In some embodiments, an opening is then formed into the insulating layer 10 and then bottom electrode 12 is formed within the opening. The opening can be formed utilizing lithography and etching. Lithography includes providing a photoresist material (not shown) on an upper surface of the insulating substrate 10, exposing the photoresist material to a desired pattern of radiation, and thereafter developing the exposed photoresist material utilizing a conventional resist developer. Etching is then used to transfer the pattern from the patterned photoresist material into the underlying insulating substrate 10. Etching may include a dry etch process (such as, for example, reactive ion etching (RIE), ion beam etching, plasma etching and/or laser ablation), and/or a wet chemical etch process. In one embodiment, RIE is used to provide the opening in the insulating substrate 10. In some embodiments, an anisotropic etch is used that provides an opening with vertical sidewalls. In other embodiments, an isotropic etch is used that provides an opening with non-vertical (i.e., sloping) sidewalls. Following the pattern transfer, the photoresist material can be removed by utilizing a resist stripping process such as, for example, ashing.

After forming the opening within the insulating substrate 10, the bottom electrode 12 is formed by deposition of a conductive metallic material into the opening. The conductive metallic material that provides the bottom electrode 12 may include, but is not limited to, titanium nitride (TiN), tungsten (W), silver (Ag), gold (Au), aluminum (Al) or multilayered stacks thereof. The conductive metallic material may be formed by a deposition process such as, for example, CVD, PECVD, physical vapor deposition (PVD), sputtering, atomic layer deposition (ALD) or plating. A planarization process or an etch back process may follow the deposition of the conductive metallic material that provides the bottom electrode 12. As is shown, the bottom electrode 12 has a topmost surface that is coplanar with a topmost surface of the insulating substrate 10.

The exemplary semiconductor structure shown in FIG. 1 may also be formed by first providing the bottom electrode 12 on a surface of a base substrate (not shown) by deposition of a conductive metallic material, followed by patterning the deposited conductive metallic material by lithography and etching. The insulating substrate 10 may then be formed by deposition of a dielectric material, followed by planarization or an etch back process.

Figure 2:
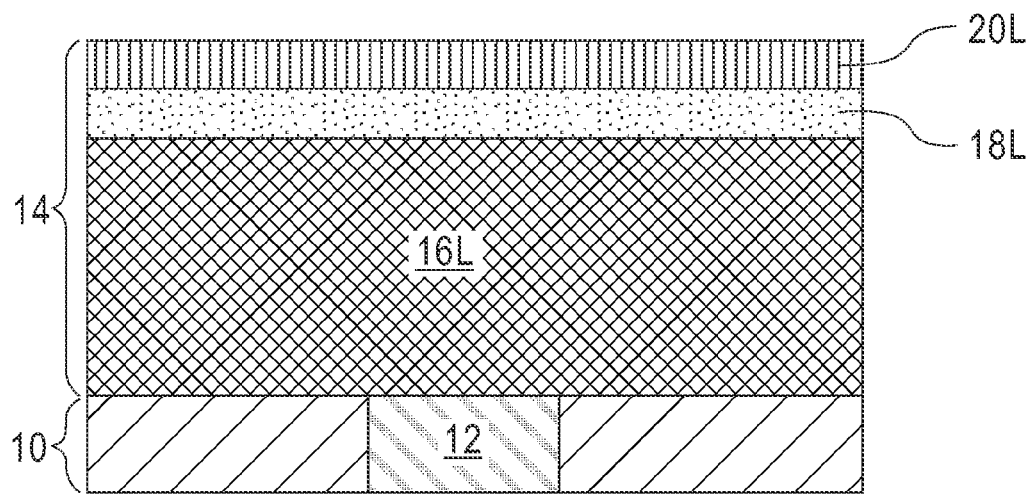
FIG. 2 is a cross sectional view of the exemplary semiconductor structure of FIG. 1 after forming a dielectric material stack of, from bottom to top, a layer of a first dielectric material, a layer of a second dielectric material and a layer of a third dielectric material in accordance with an embodiment of the present application.

Referring now to FIG. 2, there is illustrated the exemplary semiconductor structure of FIG. 1 after forming a dielectric material stack 14. The dielectric material stack 14 is formed over the insulating substrate 10 and over the bottom electrode 12. In one embodiment of the present application and as illustrated, the dielectric material stack 14 includes, from bottom to top, a layer of a first dielectric material 16L, a layer of a second dielectric material 18L and a layer of a third dielectric material 20L.

In accordance with this embodiment of the present application, the layer of second dielectric material 18L comprises a dielectric material that has a slower etch rate during a subsequent lateral etch than the dielectric material that provides the layer of first dielectric material 14L and the dielectric material that provides the layer of third dielectric material 20L. In one embodiment of the present application, the layer of first dielectric material 16L, and the layer of third dielectric material 20L may comprise a same dielectric material, which differs from that of dielectric material that provides the second layer of dielectric material 18L. In another embodiment of the present application, the layer of first dielectric material 16L, the layer of second dielectric material 18L and the layer of third dielectric material 20L may comprise different dielectric materials.

The dielectric material that provides the layer of first dielectric material 16L, the layer of second dielectric material 18L and the layer of third dielectric material 20L may comprise one of the dielectric materials mentioned above for the insulating substrate 10 so long as the layer of second dielectric material 18L comprises a dielectric material that has a slower etch rate during a subsequent lateral etch than the dielectric material that provides the layer of first dielectric material 14L and the dielectric material that provides the layer of third dielectric material 20L. In one example, the layer of first dielectric material 16L, and the layer of third dielectric material 20L each comprise silicon dioxide, while the layer of second dielectric material 16L may comprise silicon nitride.

The dielectric material that provides the layer of first dielectric material 16L, the layer of second dielectric material 18L and the layer of third dielectric material 20L may be formed utilizing one of the deposition processes mentioned above in providing the dielectric material for insulating substrate 10. In one embodiment, a same deposition process can be used in forming each material layer of the dielectric material stack 14. In another embodiment, different deposition processes are used in forming each material layer of dielectric material stack 14. In yet another embodiment, any two of the material layers of the dielectric material stack 14 can be formed utilizing a same deposition process, while the remaining material layer of the dielectric material stack 14 can be formed by a different deposition process.

The thickness of the layer of first dielectric material 16L may be in a range from 50 nm to 500 nm, while the thickness of the layer of second dielectric material 18L can be in a range from 10 nm to 150 nm, while the thickness of the layer of third dielectric material 20L can be in a range from 10 nm to 150 nm. Other thickness that are lesser than or greater than the aforementioned thickness ranges can also be employed as the thickness of the layer of first dielectric material 16L, the layer of second dielectric material 18L and the layer of third dielectric material 20L.

Figure 3:
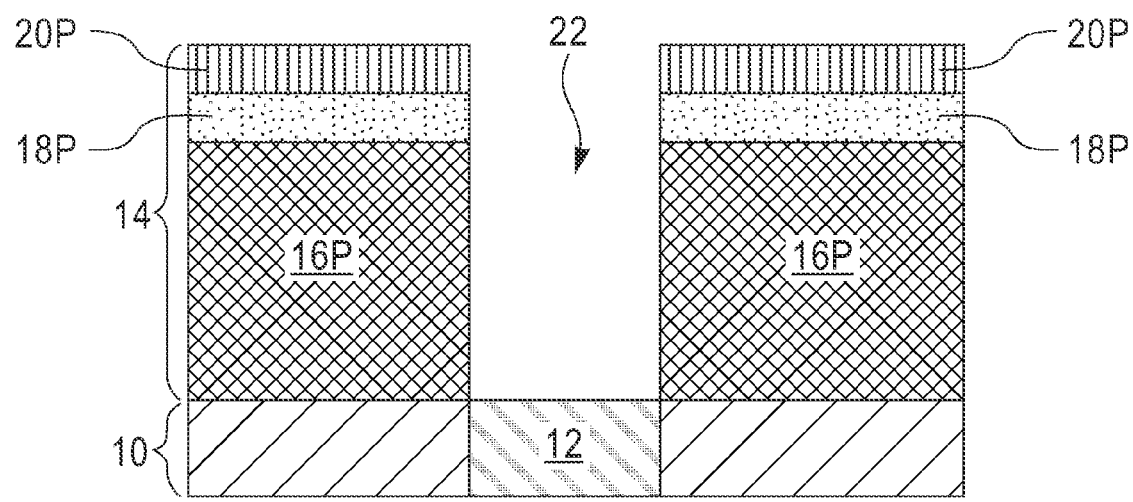
FIG. 3 is a cross sectional view of the exemplary semiconductor structure of FIG. 2 after forming a via opening within the dielectric material stack that exposes a surface of the bottom electrode embedded in the insulating substrate.

Referring now to FIG. 3, there is illustrated the exemplary semiconductor structure of FIG. 2 after forming a via opening 22 within the dielectric material stack 14 that exposes a surface of the bottom electrode 12 embedded in the insulating substrate 10. Although a single via opening 22 is described and illustrated, a plurality of such via openings can be formed that expose a surface of an underlying bottom electrode 12. In some embodiments (as shown), the via opening 22 has vertical sidewalls. In other embodiments (not shown), the via opening 22 may have non-vertical sidewalls.

The via opening 22 can be formed by patterning the dielectric material stack 14. In one embodiment, the dielectric material stack 14 can be patterned by lithography and etching. In another embodiment, the dielectric material stack 14 may be patterned utilizing a sidewall image transfer process. The via opening 22 can have a width, as measured from one sidewall to another sidewall within the opening, that is from 10 nm to 70 nm. After patterning the dielectric material stack 14, portions of the layer of the first dielectric material 16L, portions of the layer of second dielectric material 18L and portions of the layer of third dielectric material 20L remain. The remaining portions of the layer of the first dielectric material 16L may be referred to herein as first dielectric material portions 16P, the remaining portions of the layer of second dielectric material 18L may be referred to herein as second dielectric material portions 18P, and the remaining portions of the layer of third dielectric material 20L may be referred to herein as third dielectric material portions 20P.

In some embodiments, and as shown, the via opening 22 stops on a topmost surface of the bottom electrode 12. In some embodiments, the via opening 22 can extend into a portion, but not entirely through, the bottom electrode 12.

Figure 4:
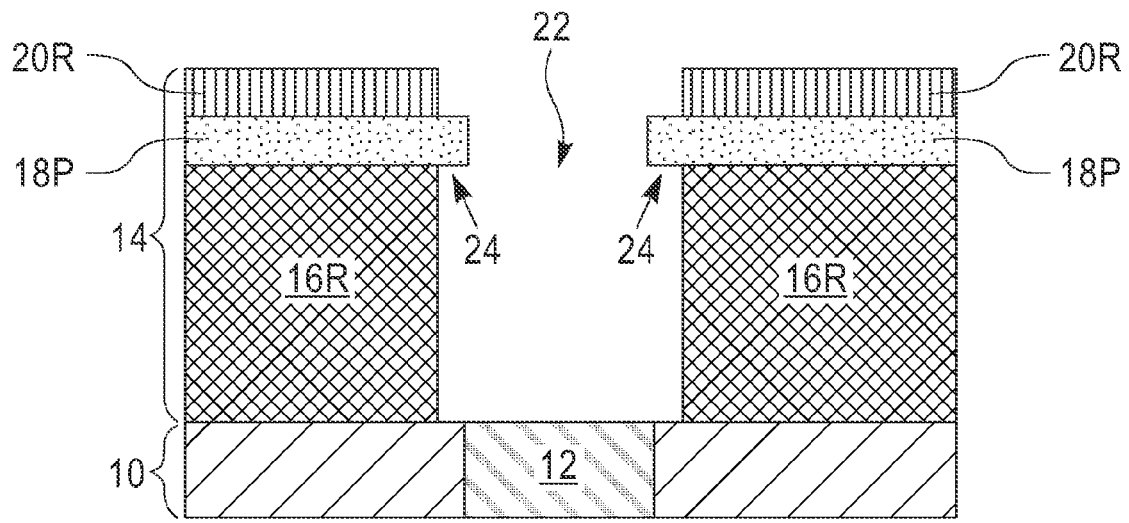
FIG. 4 is a cross sectional view of the exemplary semiconductor structure of FIG. 3 after performing a lateral etch of remaining portions of the layer of first dielectric material and remaining portions of the layer of third dielectric material.

Referring now to FIG. 4, there is illustrated the exemplary semiconductor structure of FIG. 3 after performing a lateral etch of the remaining portions of the layer of first dielectric material (i.e., first dielectric material portions 16P) and the remaining portions of the layer of third dielectric material (i.e., third dielectric material portions 20P). The remaining portions of the layer of second dielectric material (i.e., second dielectric material portions 18P) are not etched during this step of the present application. As a result, an overhang region 24 is created beneath a protruding portion of the second dielectric material portions 18P. The first dielectric material portions 16P that remain after the lateral etch can be referred to as reduced length first dielectric material portions 16R, while the third dielectric material portions 20P that remain after the lateral etch can be referred to as reduced length third dielectric material portions 20R. In some embodiments, and when the layers of the first and third dielectric materials comprise a same dielectric material. The reduced length first dielectric material portions 16R has a sidewall surface (or edge) that is vertical aligned, i.e., vertical coincident, to a sidewall surface (or edge) of the reduced length third dielectric material portions 20R.

The lateral etch may be performed utilizing an etch that removes the dielectric material that provides the layer of first dielectric material and the layer of third dielectric material at a rate that is faster than the layer of second dielectric material. In one embodiment, and when the layer of first and third dielectric materials comprise silicon dioxide, and the layer of second dielectric material comprises silicon nitride, a dilute HF etchant can be used to provide the structure shown in FIG. 4 of the present application.

Figure 5:
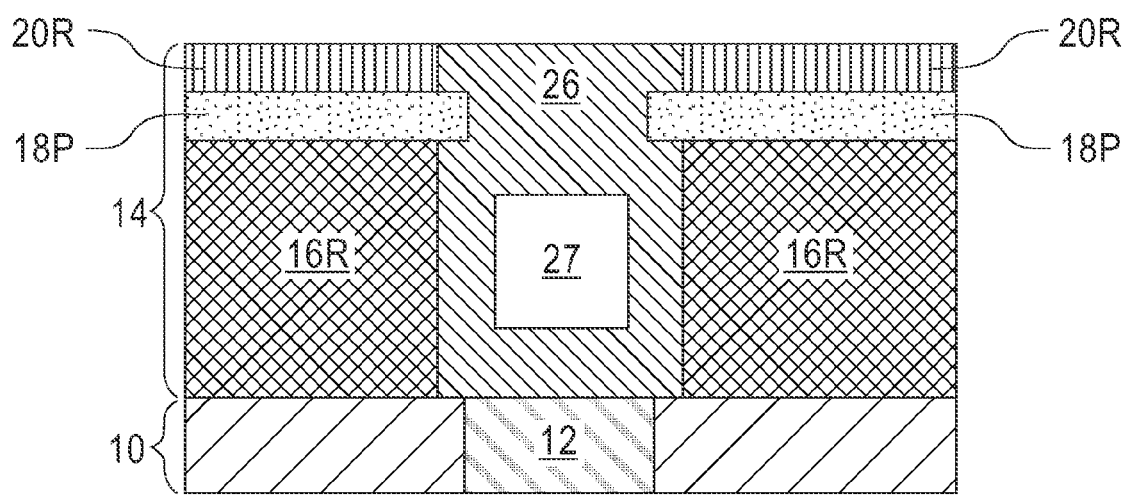
FIG. 5 is a cross sectional view of the exemplary semiconductor structure of FIG. 4 after formation of metal nitride keyhole forming material within the via opening and having a topmost surface that is coplanar with a topmost surface of each remaining portion of the layer of third dielectric material.

Referring now to FIG. 5, there is illustrated the exemplary semiconductor structure of FIG. 4 after formation of metal nitride keyhole forming material 26 within the via opening 22 and having a topmost surface that is coplanar with a topmost surface of each remaining portion of the layer of third dielectric material (i.e., the reduced length third dielectric material portions 20R). As is shown, a void (or keyhole) 27 is provided within a portion of the via opening 22. The metal nitride keyhole forming material 26 and the keyhole 27 can be first formed by deposition of a conformal metal nitride material. The deposition of the conformal metal nitride material that provides the metal nitride keyhole forming material 26 may include CVD or PECVD. The conformal metal nitride material that provides the metal nitride keyhole forming material 26 comprises a compound of the formula M-X—N wherein M is Ti or Ta, and X is Al or Si. Following deposition of the conformal metal nitride material that provides the metal nitride keyhole forming material 26, the conformal metal nitride material is planarized to provide the structure shown in FIG. 5. Planarization, which removes any conformal metal nitride from atop the reduced length third dielectric material portions 20R, may include chemical mechanical planarization (CMP) and/or grinding.

Figure 6:
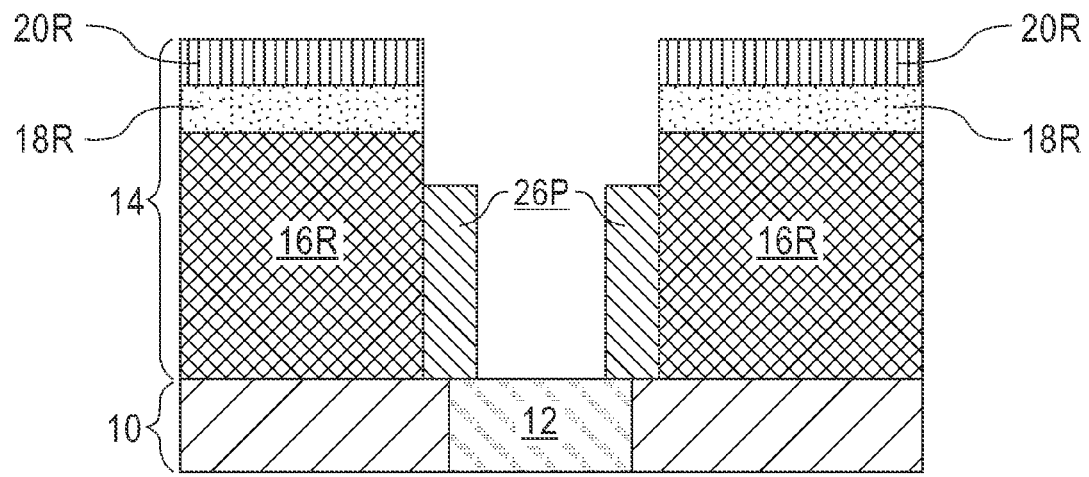
FIG. 6 is a cross sectional view of the exemplary semiconductor structure of FIG. 5 after removing an upper portion of the metal nitride keyhole forming material and a protruding portion of the layer of second dielectric material within the via opening.

Referring now to FIG. 6, there is illustrated the exemplary semiconductor structure of FIG. 5 after removing an upper portion of the metal nitride keyhole forming material 26 and the protruding portion of the layer of second dielectric material (i.e., a protruding portion of each second dielectric material portion 18P) within the via opening 22. The removal of the upper portion of the metal nitride keyhole forming material 26 and a protruding portion of the layer of second dielectric material may be performed by an etch such as, for example, RIE. After etching, the remaining metal nitride keyhole forming material 26 may be referred to as a metal nitride spacer 26P. As is shown, the metal nitride spacer 26P has a sidewall surface that is located on a sidewall of each reduced length first dielectric material portion 16R. The height of each metal nitride spacer 26P is below the topmost surface of each reduced length first dielectric material portion 16R. Thus, an upper sidewall surface of each reduced length first dielectric material portion 16R within the via opening 22 is not covered by a metal nitride spacer 26P.

At this point of the present application, the via opening 22 has an upper portion (located above each metal nitride spacer 26P) that has a width that is greater than a width of a lower portion of the via opening 22 that is located between each metal nitride spacer 26P. The via opening 22 is now T-shaped. Also, each metal nitride spacer 26P includes a bottommost surface that has a first portion located on a topmost surface of the insulator substrate 10 and a second portion that extends onto a surface of the bottom electrode 12.

Figure 7:
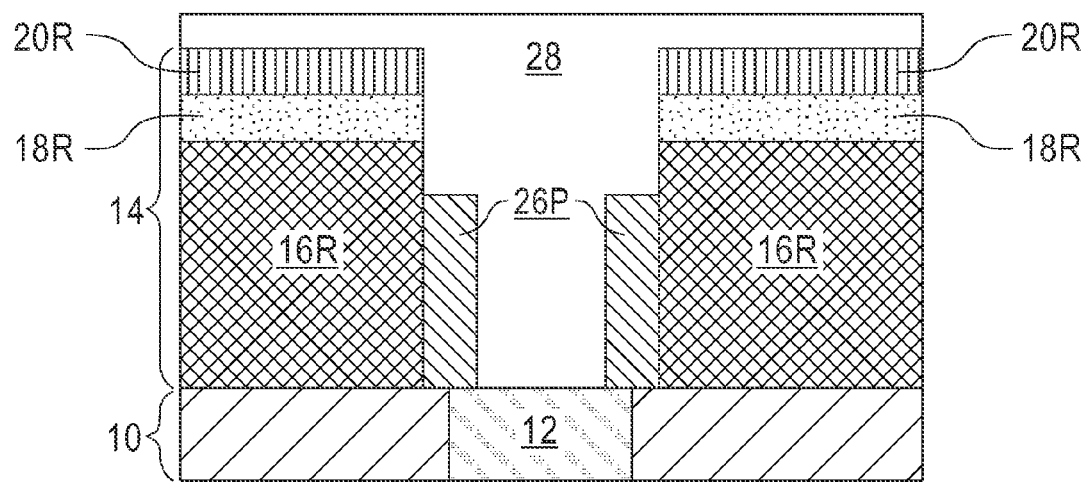
FIG. 7 is a cross sectional view of the exemplary semiconductor structure of FIG. 6 after filling a remaining volume of the via opening with a phase change material.

Referring now to FIG. 7, there is illustrated the exemplary semiconductor structure of FIG. 6 after filling a remaining volume of the via opening 22 with a phase change material 28. As is shown, the phase change material is formed on exposed sidewall surfaces of the reduced length first dielectric material portions 16R, the reduced length second dielectric material portions 18R and the reduced length third dielectric material portions 20R, and exposed sidewalls and a topmost surface of each metal nitride spacer 26P. As is further shown, the phase change material 28 is formed on a portion of the surface of the bottom electrode 12 that is not covered by the metal nitride spacer 26P as well as a topmost surface of the reduced length third dielectric material portion 20R.

In some embodiments of the present application, the phase change material 28 comprises a chalcogenide. Chalcogenides are comprised of an element from Group 16 (i.e., a chalcogen) of the Periodic Table of Elements and a more electropositive element. Examples of chalcogens that can be used to provide the phase change material 28 include $Ge_2Sb_2Te_5$ (GST), SbTe, and $In_2Se_3$. Other materials can also be used as the phase change material 28 so long as the other material can retain separate amorphous and crystalline states. The phase change material 28 can be provided into the via opening by a deposition process such as, for example, CVD, PECVD or atomic layer deposition (ALD).

Figure 8:
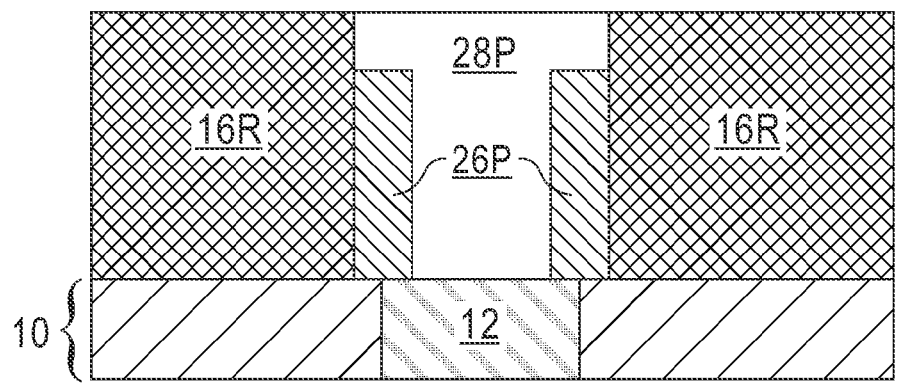
FIG. 8 is a cross sectional view of the exemplary semiconductor structure of FIG. 7 after removing an upper portion of the phase change material, remaining portions of the layer of third dielectric material and remaining portions of the layer of second dielectric material.

Referring now to FIG. 8, there is illustrated the exemplary semiconductor structure of FIG. 7 after removing an upper portion of the phase change material 28, remaining portions of the layer of third dielectric material (i.e., reduced length third dielectric material portions 20R) and remaining portions of the layer of second dielectric material (i.e., reduced length second dielectric material portions 18R). The structure shown in FIG. 8 can be formed utilizing a planarization process such as, for example, CMP and/or grinding. The phase change material 28 that remains within the via opening 22 after planarization is referred to herein as a phase change material structure 28P. As is shown, the topmost surface of the phase change material structure 28P is coplanar with the topmost surface of the remaining portions of the layer of first dielectric material (i.e., reduced length first dielectric material portions 16R). In this embodiment (and as shown), the phase change material structure 28P is T-shaped. In accordance with the present application, the phase change material structure 28P has portions that directly contact sidewall surfaces of the first dielectric material (i.e., 16R), portions that directly contact a topmost surface of each metal nitride spacer 26P, portions that contact sidewall surface of each metal nitride spacer 26P, and a bottommost surface the directly contacts the bottom electrode 12.

Figure 9A:
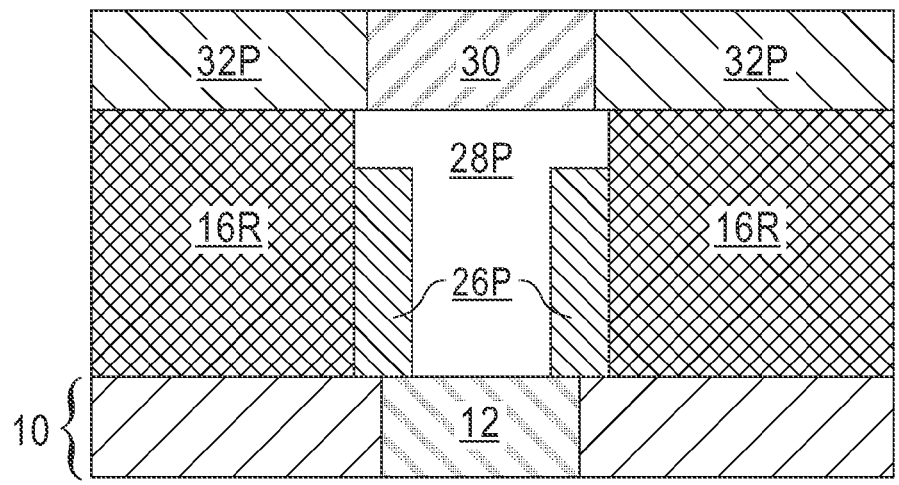
FIG. 9A is a cross sectional view of the exemplary semiconductor structure of FIG. 8 after forming a top electrode on a topmost surface of a phase change material structure.

Referring now to FIG. 9A, there is illustrated the exemplary semiconductor structure after forming a top electrode 30 on a topmost surface of the phase change material structure 28P. In some embodiments, the top electrode 30 can be embedded, i.e., housed, within top insulating substrate 32P. In some embodiments, the top insulating substrate 32P can be omitted.

The top electrode 30 may comprise one of the conductive metallic materials mentioned above in providing the bottom electrode 12. In some embodiments, the top electrode 18 and the bottom electrode 12 comprise a same conductive metallic material. In other embodiments, the top electrode 18 and the bottom electrode 12 comprise a different conductive metallic material. The top insulating substrate 32P may comprise one of the dielectric materials mentioned above for insulating substrate 10. In one embodiment, the top insulating substrate 32P and the insulating substrate 10 comprise a same dielectric material. In another embodiment, the top insulating substrate 32P and the insulating substrate 10 comprise a different dielectric material. The top electrode 30 and top insulating substrate 32P can be formed as described above in providing the structure shown in FIG. 1 of the present application.

Figure 9B:
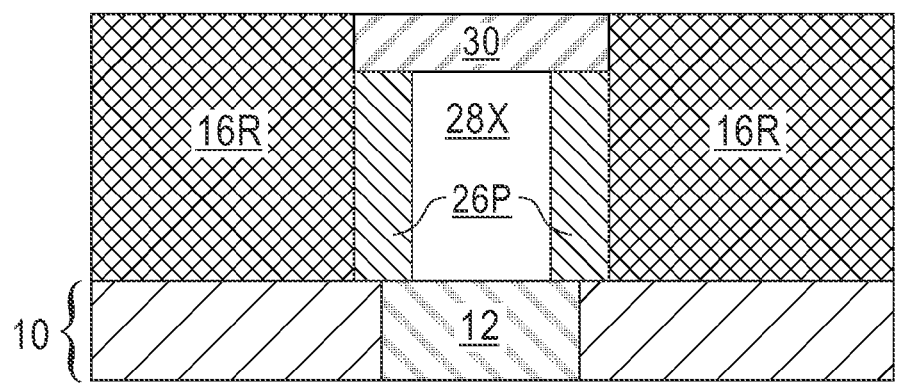
FIG. 9B is a cross sectional view of the exemplary semiconductor structure of FIG. 8 after recessing a top portion of the phase change material structure and forming a top electrode within the area previously occupied by the removed top portion of the phase change material structure.

Referring now to FIG. 9B, there is illustrated the exemplary semiconductor structure of FIG. 8 after recessing a top portion of the phase change material structure 28P and forming a top electrode 30 within the area previously occupied by the removed top portion of the phase change material structure 28P. The remaining phase change material structure 28P may be referred to herein as a reduced height phase change material structure 28X. The recessing of the top portion of the phase change material structure 28P may be performed utilizing an etch back process. The recessing exposes sidewalls of the remaining first dielectric material portions 16R as well as a topmost surface of each metal nitride spacer 26P. The top electrode 30 comprises one of materials mentioned above in providing the top electrode to the structure shown in FIG. 9A. Also, the top electrode 30 of this embodiment can be formed utilizing one of the deposition processes mentioned above and a planarization process may follow to provide the planarized structure shown in FIG. 9B. In this embodiment of the present application the phase change material structure is completely encases between bottom and top electrodes (12 and 30) and between metal nitride spacers 26P.

Figure 10:
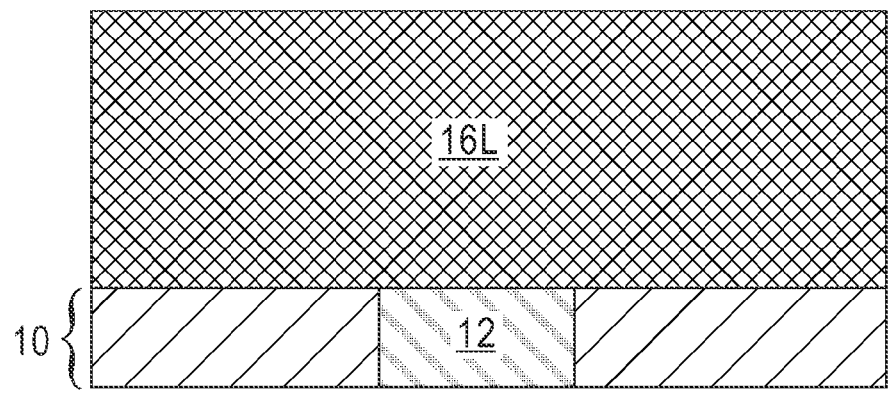
FIG. 10 is a cross sectional view of the exemplary semiconductor structure of FIG. 1 after forming a layer of a first dielectric material in accordance with another embodiment of the present application.

Referring now to FIG. 10, there is illustrated the exemplary semiconductor structure of FIG. 1 after forming a layer of first dielectric material 16L in accordance with another embodiment of the present application. The layer of first dielectric material 16L is formed over insulating substrate 10 and the bottom electrode 12. The layer of first dielectric material 16L is the same as the layer of first dielectric material 16L used in providing the dielectric material stack 14 shown in FIG. 2 of the previous embodiment of the present application. Thus, the dielectric material, deposition processes and thickness ranges mentioned above for the layer of first dielectric material 16L apply equal well here in this embodiment of the present application.

Figure 11:
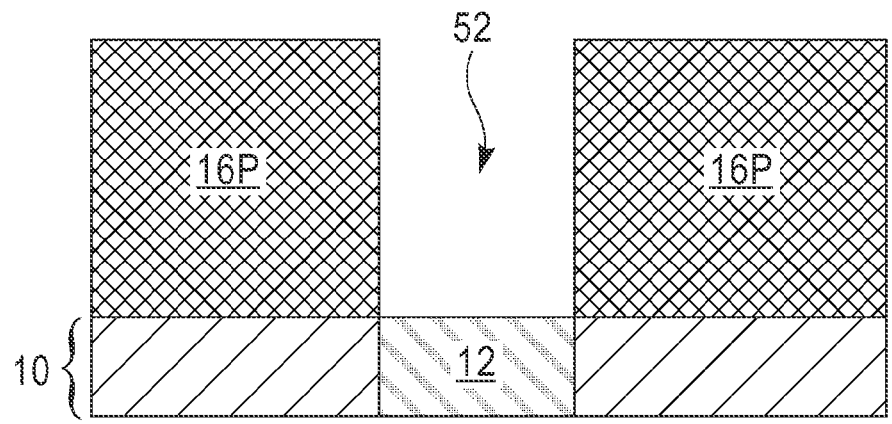
FIG. 11 is a cross sectional view of the exemplary semiconductor structure of FIG. 10 after forming a via opening in the layer of first dielectric material that exposes a surface of the bottom electrode.

Referring now to FIG. 11, there is illustrated the exemplary semiconductor structure of FIG. 10 after forming a via opening 52 in the layer of first dielectric material 16L that exposes a surface of the bottom electrode 12. The via opening 52 of this embodiment of the present application can be formed utilizing one of the patterning methods used in forming the via opening 22 shown in FIG. 3 of the previous embodiment of the present application. Via opening 52 has a width that is also within the widths mentioned above for via opening 22. The layer of first dielectric material 16L that remains after the formation of via opening 52 may be referred to herein as first dielectric material portions 16P.

Figure 12:
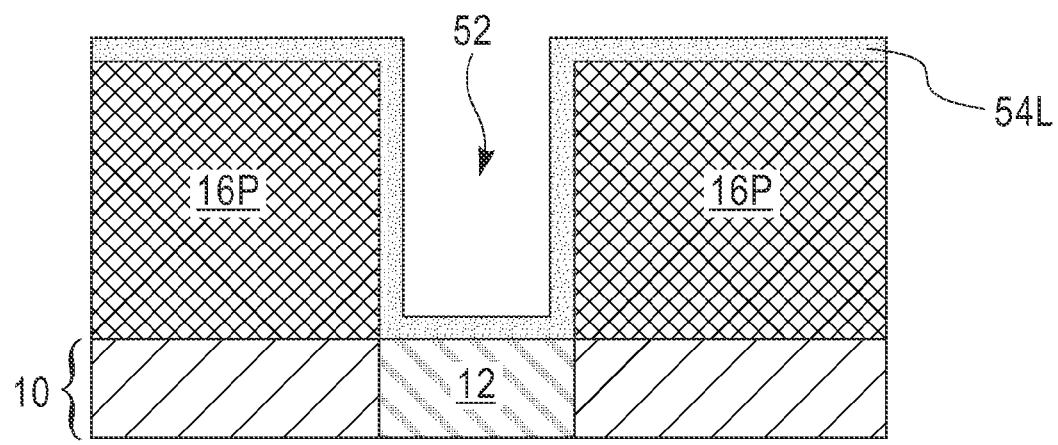
FIG. 12 is a cross sectional view of the exemplary semiconductor structure of FIG. 11 after forming a metal nitride layer.

Referring now to FIG. 12, there is illustrated the exemplary semiconductor structure of FIG. 11 after forming a metal nitride layer 54L. Metal nitride layer 54L is a contiguous layer that follows the contour of the structure shown in FIG. 11. Thus, the metal nitride layer 54L is formed on the upper horizontal surface of each first dielectric material portion 16P, along sidewall surfaces of each first dielectric material portion 16P and along the exposed surface of the bottom electrode 12.

The metal nitride layer 54L includes a compound of the formula M-X—N wherein M is Ti or Ta, and X is Al or Si. The metal nitride layer 54L can be formed by a conformal deposition process such as, for example, CVD, PECVP, or PVP. The metal nitride layer 54L that is formed in this embodiment of the present application has a thickness from 5 nm to 20 nm. Other thickness that are lesser than or greater than the aforementioned thickness range may also be used as the thickness of the metal nitride layer 54L.

Figure 13:
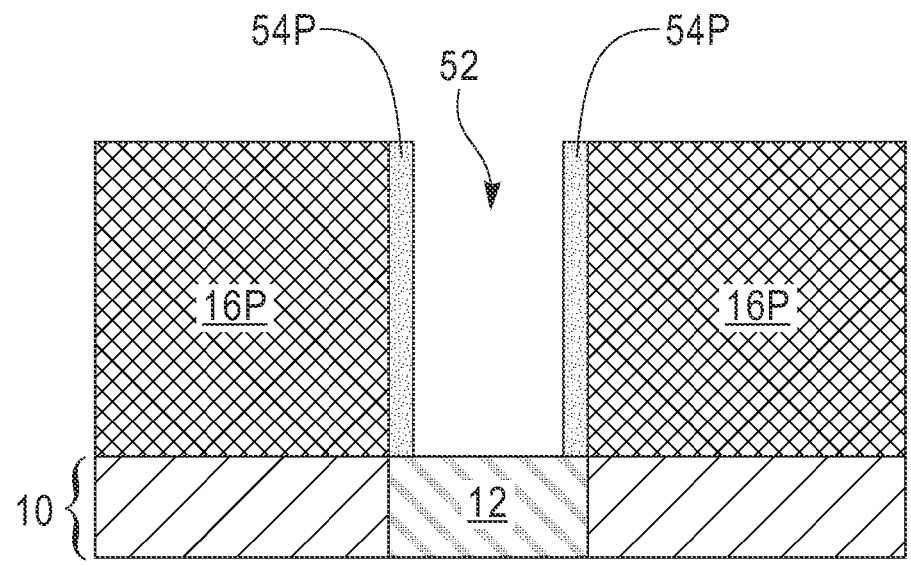
FIG. 13 is a cross sectional view of the exemplary semiconductor structure of FIG. 12 after removing portions of the metal nitride layer that are located on all horizontal surfaces to provide a metal nitride portion located on each sidewall surface of the via opening.

Referring now to FIG. 13, there is illustrated the exemplary semiconductor structure of FIG. 12 after removing portions of the metal nitride layer 54L that are located on all horizontal surfaces to provide a metal nitride portion 54P located on each sidewall of the via opening 52. The removal of the portions of the metal nitride layer 54L that are located on all horizontal surfaces can be achieved utilizing RIE. As is shown, the topmost surface of each first dielectric material portion 16P is bare after metal nitride portion 54P formation. As is also shown, a portion of the surface of the bottom electrode 12 is also bare after metal nitride portion 54P formation. Each metal nitride portion 54P that is formed has a sidewall surface that contacts a sidewall surface of a first dielectric material portion 16P. Also, this sidewall surface of the metal nitride portion 54P that contacts the sidewall of the first dielectric portion 16P is vertical coincident to an edge of the bottom electrode 12.

Figure 14:
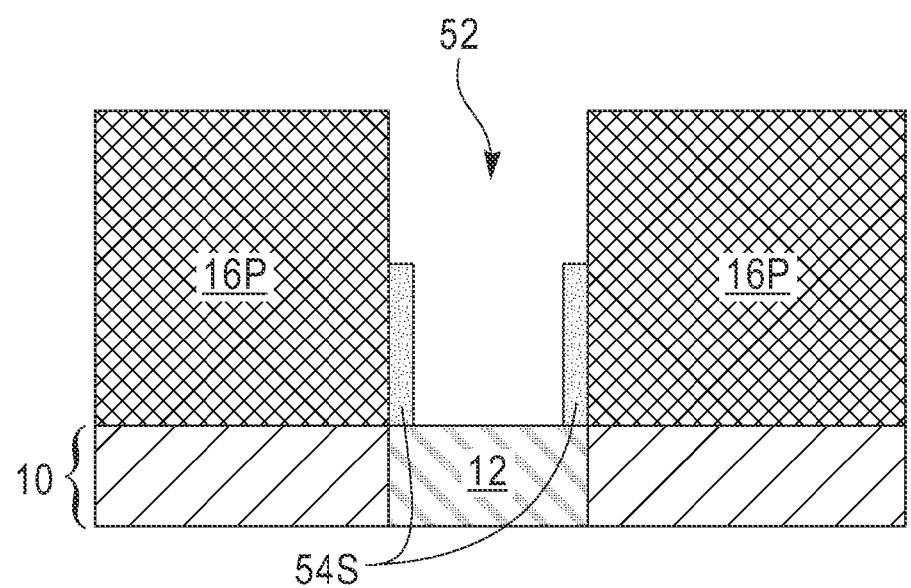
FIG. 14 is a cross sectional view of the exemplary semiconductor structure of FIG. 13 after removing an upper portion of each metal nitride portion to provide a metal nitride spacer.

Referring now to FIG. 14, there is illustrated the exemplary semiconductor structure of FIG. 13 after removing an upper portion of each metal nitride portion 54P to provide metal nitride spacers 54S within a lower portion of the via opening 52. In some embodiments of the present application, this step is optional and processing continues by filling the via opening with a phase change material and then forming a top electrode on a top surface of the phase change material. In the illustrated embodiment, the via opening 52 including the metal nitride spacers 54S is now T-shaped, and within an upper portion of the via opening 52 the sidewall surfaces of each first dielectric material portion 16P are re-exposed. The removal of the upper portion of each metal nitride portion 54P may be performed utilizing an etch back process including an etch that selectively removes metal nitride material that provided the metal nitride layer 54. In some embodiments of the present application and during the removal of the upper portion of each metal nitride portion 54P, an etch back process can be used that partially and selectively removes metal nitride material that provides metal nitride layer 54, and partially removes a portion of bottom electrode 12.

Figure 15:
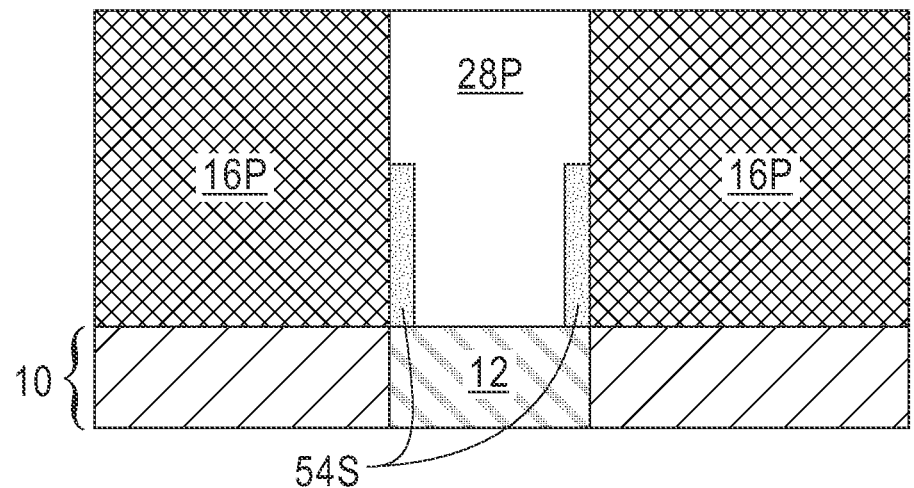
FIG. 15 is a cross sectional view of the exemplary semiconductor structure of FIG. 14 after forming a phase change material structure within a remaining volume of the via opening.

Referring now to FIG. 15, there is illustrated the exemplary semiconductor structure of FIG. 14 after forming a phase change material structure 28P within a remaining volume of the via opening 52. The phase change metal structure 28P that is formed in this embodiment of the present application includes one of the phase change materials mentioned above in the previous embodiment of the present application. Also, the phase change metal structure 28P that is formed in this embodiment of the present application can be formed as described above in forming the phase change material structure 28P in the previous embodiment of the present application. The resultant phase change material structure 28P is now T-shaped.

Figure 16:
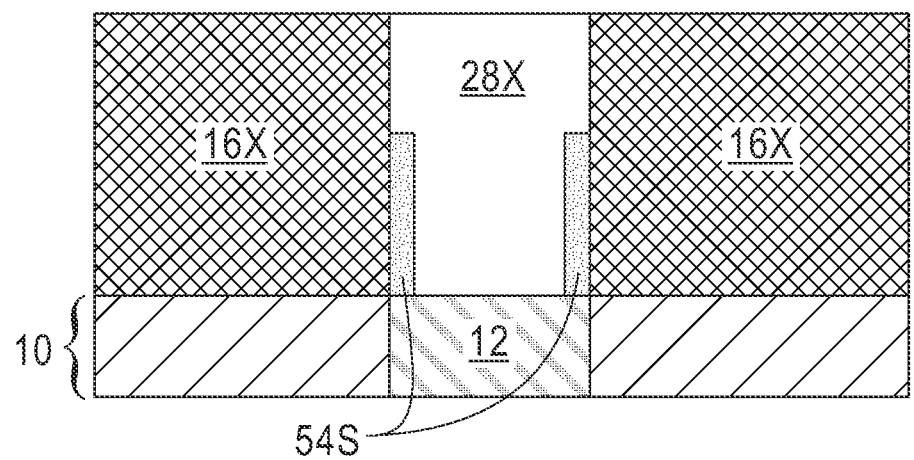
FIG. 16 is a cross sectional view of the exemplary semiconductor structure of FIG. 15 after performing an optional planarization process.

Referring now to FIG. 16, there is illustrated the exemplary semiconductor structure of FIG. 15 after performing an optional planarization process. The optional planarization process removes an upper portion of each first dielectric material portion 16P and an upper portion of the phase change material structure 28P. Each remaining first dielectric material portion is labeled as 16X to denote a reduced height first dielectric material, and the remaining phase change material structure is labeled as 28X to denote a reduced height phase change material structure. No portion of the metal nitride spacer 54S is removed.

Figure 17A:
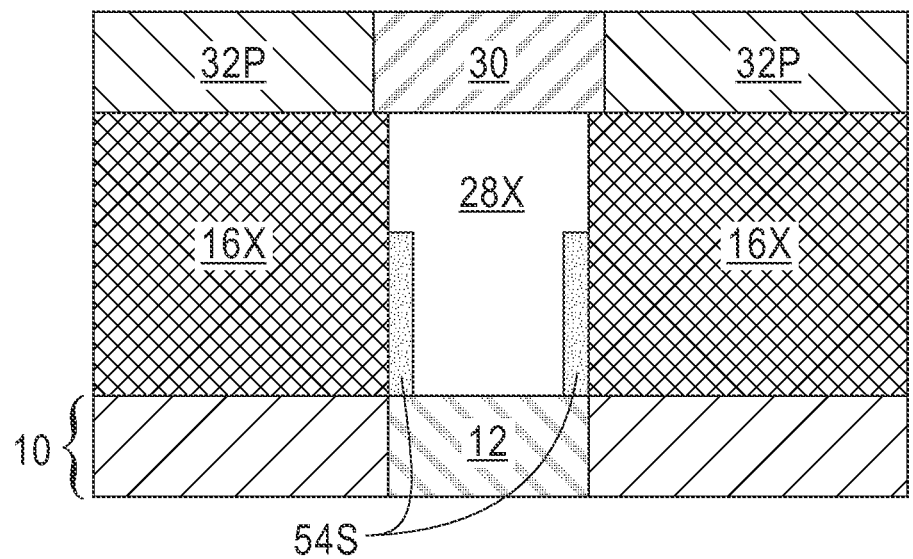
FIG. 17A is a cross sectional view of the exemplary semiconductor structure of FIG. 16 after forming a top electrode on at least a topmost surface of the phase change material structure.

Referring now to FIG. 17A, there is illustrated the exemplary semiconductor structure of FIG. 16 after forming a top electrode 30 on at least a topmost surface of the phase change material structure 28X (or 28P if no planarization is performed). The top electrode 30 used in this embodiment of the present application is the same as described in the previous embodiment of the present application. The top electrode 30 used in this embodiment of the present application can also be embedded with a top insulating substrate 32P. Top insulating substrate 32P used in this embodiment of the present application is the same as in the previous embodiment of the present application.

Figure 17B:
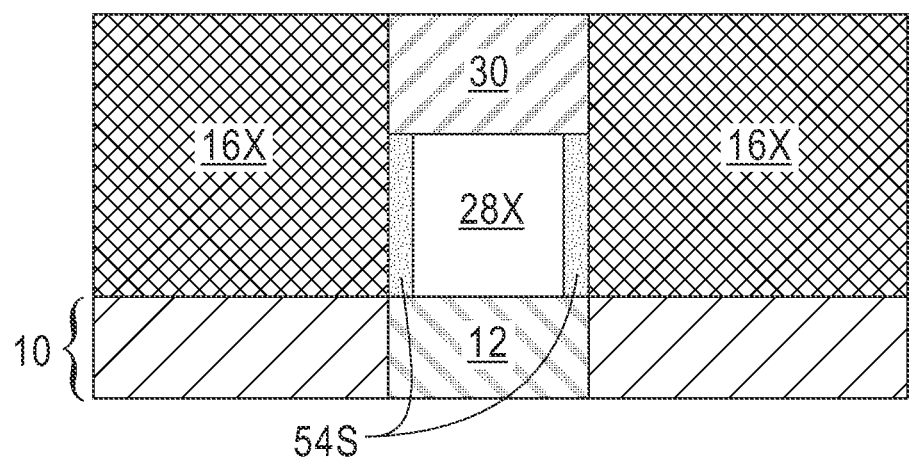
FIG. 17B is a cross sectional view of the exemplary semiconductor structure of FIG. 16 after recessing a top portion of the phase change material structure and forming a top electrode within the area previously occupied by the removed top portion of the phase change material structure.

Referring now to FIG. 17B, there is illustrated the exemplary semiconductor structure of FIG. 16 after recessing a top portion of the phase change material structure and forming a top electrode 30 within the area previously occupied by the removed top portion of the phase change material structure. This embodiment includes the processing steps mentioned above in forming the structure shown in FIG. 8B.

It should be noted that structures shown in FIGS. 17A and 17B can be made utilizing a single hole defining sequence of steps (for example, a single lithography process, a double patterning lithography process, or a sequence of two perpendicular sidewall image transfer steps. In such an embodiment, blanket layers of insulating substrate and the layer of first dielectric material are formed. A via opening is then formed entirely through the layer of first dielectric material and partially into the insulating substrate. Bottom electrode 12 is then formed within a bottommost portion of the via opening and within the insulating substrate, and then processing continues as described above.

Figure 17C:
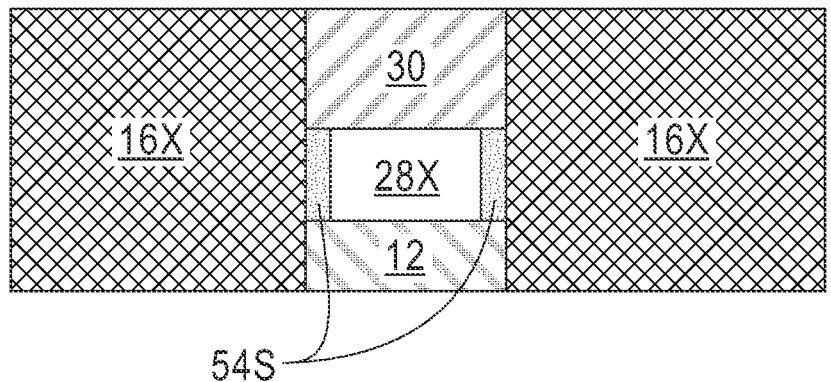
FIG. 17C is a cross sectional view of another exemplary semiconductor structure of the present application which can be made using a variation of the processing shown in FIGS. 10-15 and 17B.

Referring now to FIG. 17C, there is illustrated another exemplary semiconductor structure of the present application which can be made using a variation of the processing shown in FIGS. 10-15 and 17B. In this embodiment, the bottom electrode 12 is formed within the bottommost portion of the via opening 52 and thus it contacts sidewalls of the remaining first dielectric material portions 16X. In this embodiment, the bottom electrode 12 has a bottommost surface that is coplanar with a bottommost surface of each first dielectric material portion 16X. Also, and in this embodiment, the phase change material structure 28P and the top electrode are formed within the same via opening 52 and between the same first dielectric material portions 16X.

Figure 18:
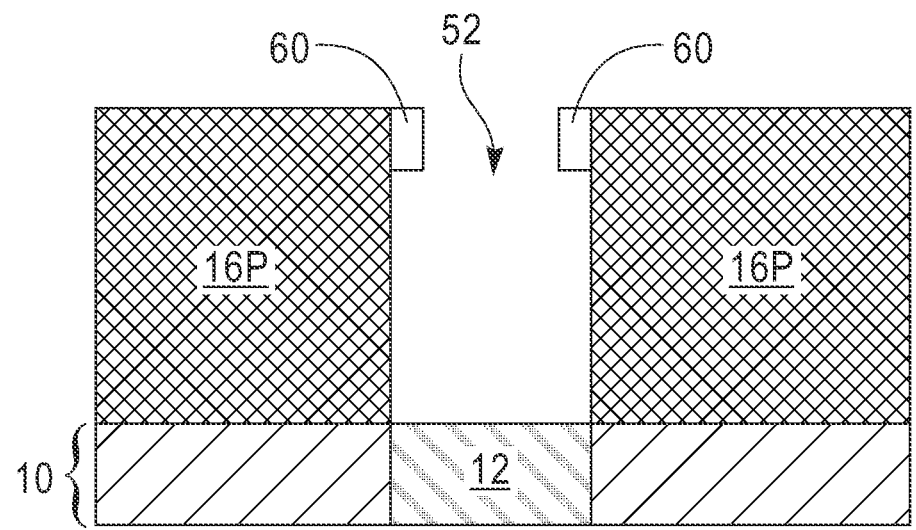
FIG. 18 is a cross sectional view of the exemplary semiconductor structure of FIG. 11 after forming a spacer on each upper sidewall surface within the via opening in accordance with yet another embodiment of the present application.

Referring now to FIG. 18, there is illustrated the exemplary semiconductor structure of FIG. 11 after forming a spacer 60 on each upper sidewall surface within the via opening 52 in accordance with yet another embodiment of the present application. The spacer 60 may include a different dielectric material than that of the first dielectric material portions 16P. In one embodiment, spacer 60 may be comprised of silicon nitride. The spacer 60 can be formed by deposition and etching.

Figure 19:
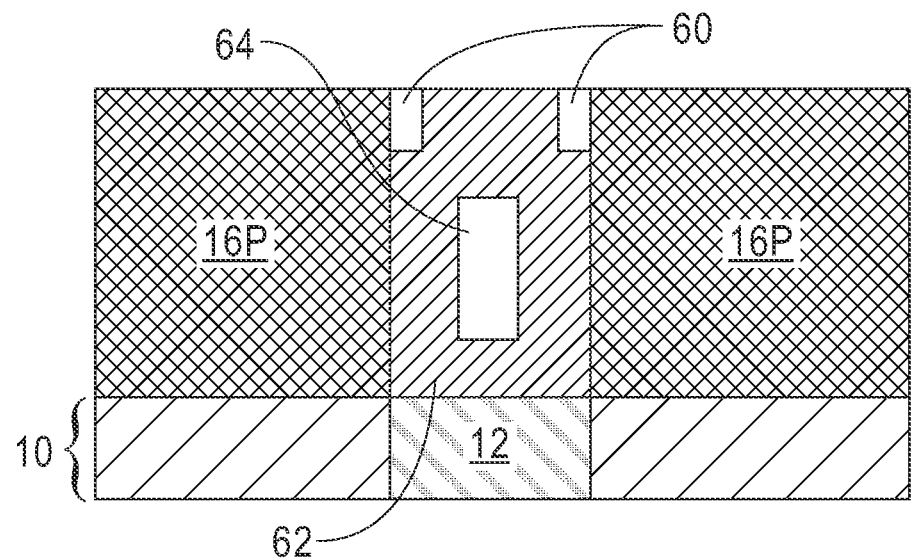
FIG. 19 is a cross sectional view of the exemplary semiconductor structure of FIG. 18 after formation of a metal nitride keyhole forming material within the via opening and having a topmost surface that is coplanar with a topmost surface of the layer of first dielectric material.

Referring now to FIG. 19, there is illustrated the exemplary semiconductor structure of FIG. 18 after formation of a metal nitride forming keyhole material 62 having a keyhole 64 within the via opening 52 and having a topmost surface that is coplanar with a topmost surface of the layer of first dielectric material (i.e., the first dielectric material portions 16P). The metal nitride keyhole forming material 62 used in this embodiment of the present application is the same as the metal nitride keyhole forming material 26 used in providing the structure shown in FIG. 5 of the present application. The metal nitride keyhole forming material 62 can be formed (i.e., deposited and planarized) as mentioned above for providing the structure shown in FIG. 5 of the present application. At this point of the present application, the metal nitride forming keyhole material 62 has a topmost surface that is coplanar with a topmost surface of each spacer 60 and each first dielectric material portion 16P.

Figure 20:
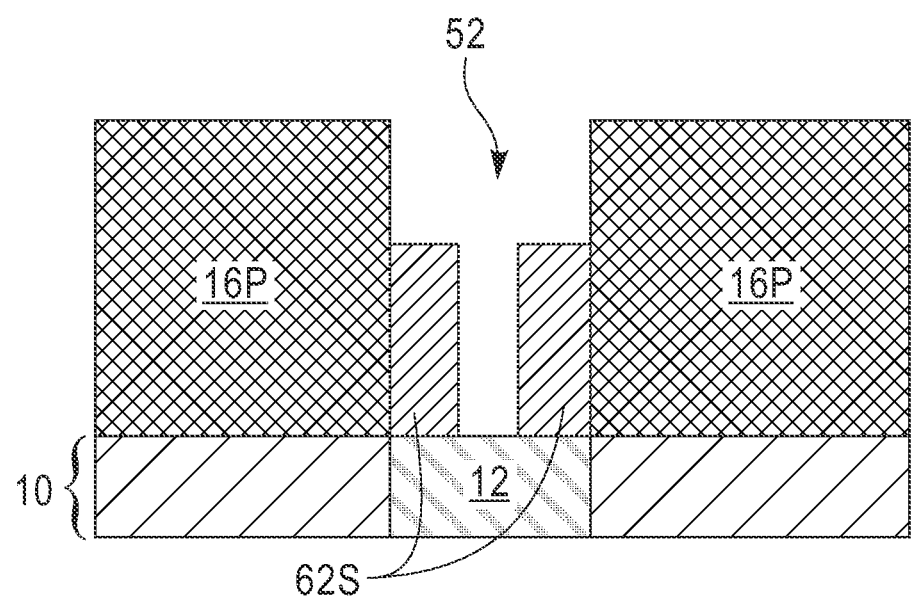
FIG. 20 is a cross sectional view of the exemplary semiconductor structure of FIG. 19 after removing an upper portion of the metal nitride keyhole forming material and the spacer within the via opening.

Referring now to FIG. 20, there is illustrated the exemplary semiconductor structure of FIG. 19 after removing an upper portion of the metal nitride keyhole material 62 and the entirety of spacer 60 within the via opening 52. The metal nitride keyhole material that remains in the via opening at this point of the present application may be referred to as metal nitride spacers 62S. The removal of the upper portion of the metal nitride keyhole material 62 and the entirety of spacer 60 within the via opening 52 can be performed utilizing RIE.

The metal nitride spacers 62S that are formed cover only a portion of the sidewall surface of each first dielectric material portion 16P. Also, the sidewall surface of each metal nitride spacer 52S that is contact with a portion of the first dielectric material portion 16P is vertical coincident with an edge of the bottom electrode 12. The via opening 52 is now T-shaped.

Figure 21:
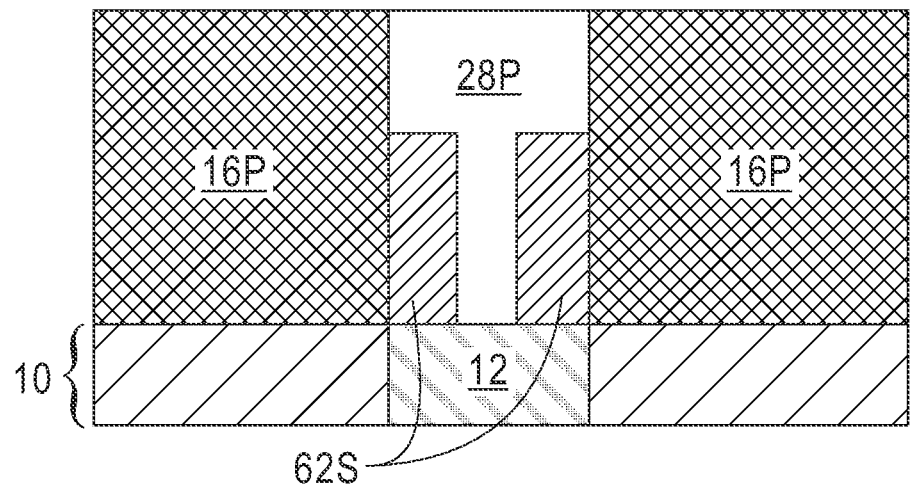
FIG. 21 is cross sectional view of the exemplary semiconductor structure of FIG. 20 after forming a phase change material structure within a remaining volume of the via opening.

Referring now to FIG. 21, there is illustrated the exemplary semiconductor structure of FIG. 20 after forming a phase change material structure 28P within a remaining volume of the via opening 52. The phase change metal structure 28P that is formed in this embodiment of the present application includes one of the phase change materials mentioned above in the previous embodiment of the present application. Also, the phase change metal structure 28P that is formed in this embodiment of the present application can be formed as described above in forming the phase change material structure 28P in the previous embodiment of the present application. The resultant phase change material structure 28P is now T-shaped.

Figure 22:
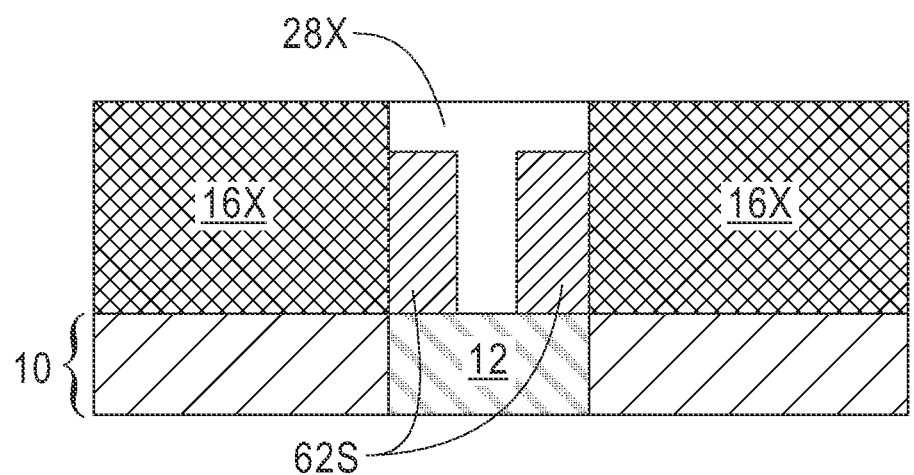
FIG. 22 is a cross sectional view of the exemplary semiconductor structure of FIG. 21 after performing an optional planarization process.

Referring now to FIG. 22, there is illustrated the exemplary semiconductor structure of FIG. 21 after performing an optional planarization process. The optional planarization process removes an upper portion of each first dielectric material portion 16P and an upper portion of the phase change material structure 28P. Each remaining first dielectric material portion is labeled as 16X to denote a reduced height first dielectric material, and the remaining phase change material structure is labeled as 28X to denote a reduced height phase change material structure. No portion of the metal nitride spacer 62S is removed.

Figure 23:
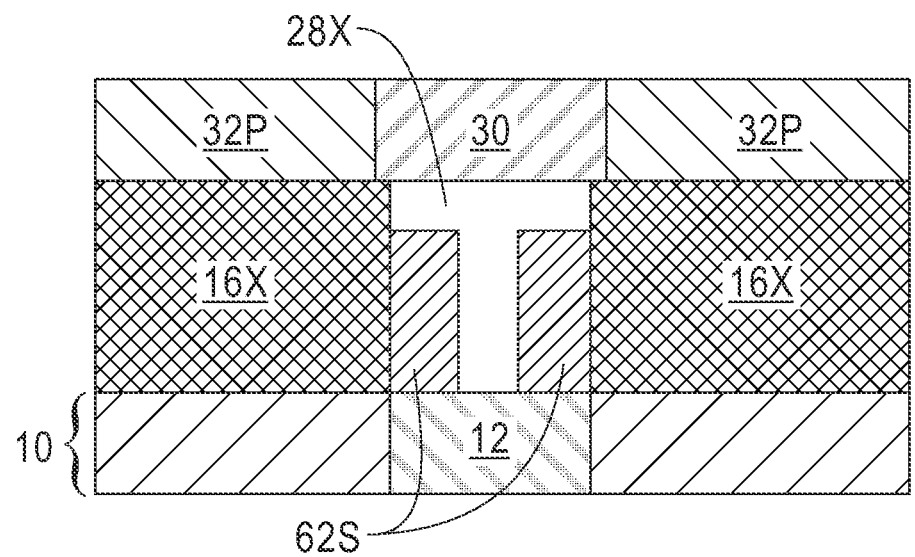
FIG. 23 is a cross sectional view of the exemplary semiconductor structure of FIG. 22 after forming a top electrode on at least a topmost surface of the phase change material structure.

Referring now to FIG. 23, there is illustrated the exemplary semiconductor structure of FIG. 22 after forming a top electrode 30 on at least a topmost surface of the phase change material structure 28X (or 28P if no planarization is performed). The top electrode 30 used in this embodiment of the present application is the same as described in the previous embodiment of the present application. The top electrode 30 used in this embodiment of the present application can also be embedded with a top insulating substrate 32P. Top insulating substrate 32P used in this embodiment of the present application is the same as in the previous embodiment of the present application. It is also possible to form the top electrode 30 within the upper portion of the via opening 52 utilizing the processing as described above for providing the structure shown in FIG. 9B.

FIGS. 24-31A, 31B and 32-41 illustrate an embodiment of the present application in which a wrap around bottom electrode metal nitride contact is formed at a bottom of a via opening. The wrap around bottom electrode metal nitride contact is present between the phase change material structure and the bottom electrode as such the contact resistance of the memory cell can be reduced. Like the previous embodiment, the resistivity of the metal nitride material that can provide the wrap around bottom electrode metal nitride contact can be tuned (based on the dimensions of the structure) so that the resistance of the metal nitride material is approximately 1/(n−1) wherein n is equal to the levels being stored in the non-volatile memory cell, times the resistance of the phase change material when in the highest resistance level at time zero (this is the known optimal value of the metal nitride material in order to maximize the retention for MLC operation).

Figure 24:
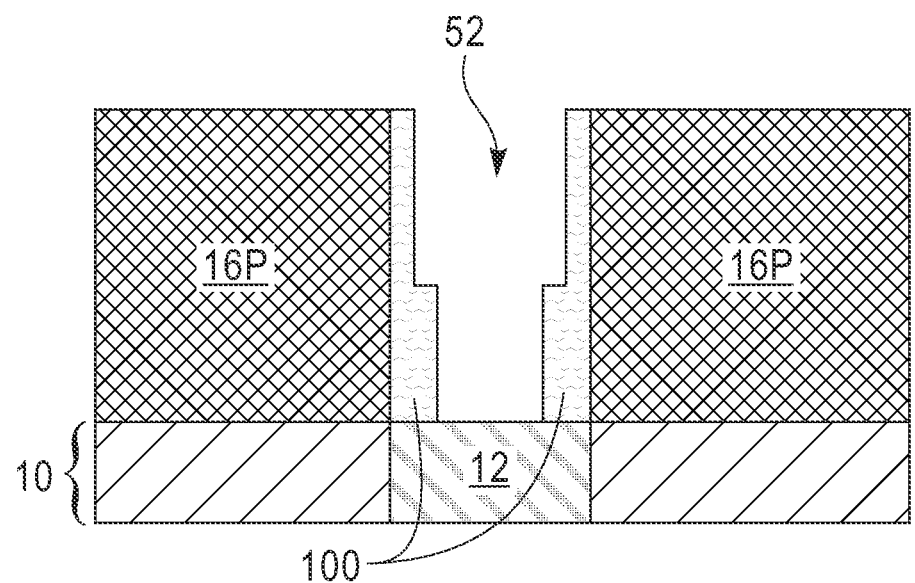
FIG. 24 is a cross sectional view of the exemplary semiconductor structure of FIG. 10 after forming a keyhole forming material spacer within a via opening formed in the layer of first dielectric material that exposes a surface of the bottom electrode in accordance with a further embodiment of the present application.

Referring first to FIG. 24, there is a cross sectional view of the exemplary semiconductor structure of FIG. 10 after forming a keyhole forming material spacer 100 within an via opening 52 formed in the layer of first dielectric material 16L that exposes a surface of the bottom electrode 12 in accordance with a further embodiment of the present application. The insulating substrate 10, the first electrode 12 and the layer of first dielectric material 16L that are used in this embodiment of the present application are the same as mentioned above in providing the exemplary semiconductor structures shown in FIGS. 1 and 2 of the present application.

In one embodiment, the keyhole forming material spacer 100 may be comprised of silicon dioxide or silicon nitride. In some embodiments, the keyhole forming material spacer 100 and the first dielectric material portions 16P may comprise a same dielectric material. In another embodiment, the keyhole forming material spacer 100 and the first dielectric material portion 16P may comprise a different dielectric material. The keyhole forming material spacer 100 can be formed utilizing a conventional keyhole forming processing that is well known to those skilled in the art.

In this embodiment, the keyhole forming material spacer 100 is present on the entire sidewall surface of each first dielectric material portion 16P within via opening 52. As is shown, the keyhole forming material spacer 100 has a bottom portion that is wider than an upper portion. As is also shown, each sidewall surface of the keyhole forming material spacer 100 that contacts a sidewall surface of the first dielectric material portion 16P is vertical coincident to an edge of the bottom electrode 12.

Figure 25:
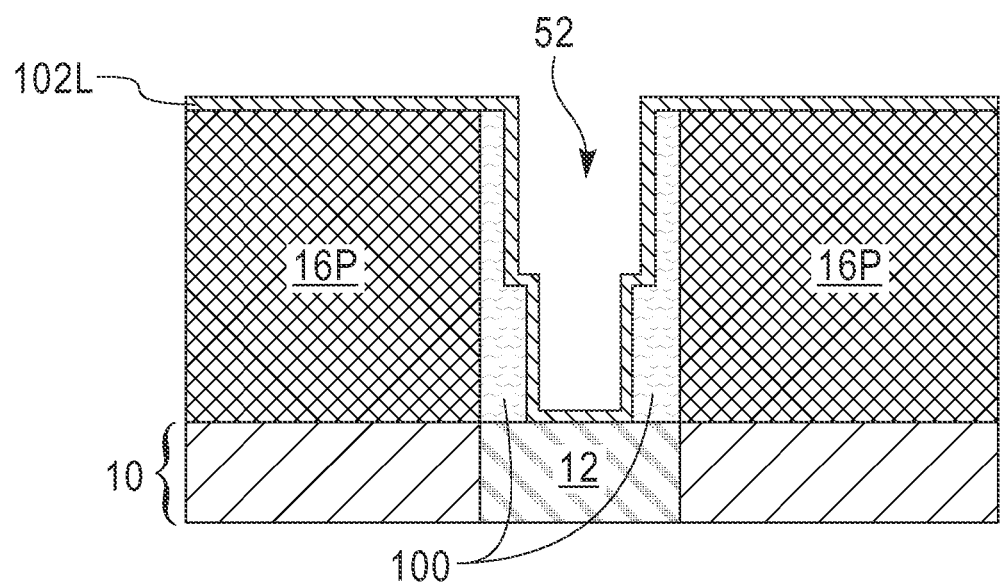
FIG. 25 is a cross sectional view of the exemplary semiconductor structure of FIG. 24 after forming a metal nitride layer.

Referring now to FIG. 25, there is illustrated the exemplary semiconductor structure of FIG. 24 after forming a metal nitride layer 102L. Metal nitride layer 102L is a contiguous layer that follows the contour of the structure shown in FIG. 24. Thus, the metal nitride layer 102L is formed on the upper horizontal surface of each first dielectric material portion 16P, along sidewall surfaces of each keyhole forming material spacer 100 and along the exposed surface of the bottom electrode 12.

The metal nitride layer 102L includes a compound of the formula M-X—N wherein M is Ti or Ta, and X is Al or Si. The metal nitride layer 102L can be formed by a conformal deposition process such as, for example, CVD, PECVP, or PVP. The metal nitride liner 102 that is formed in this embodiment of the present application has a thickness from 5 nm to 20 nm. Other thickness that are lesser than or greater than the aforementioned thickness range may also be used as the thickness of the metal nitride layer 102L.

Figure 26:
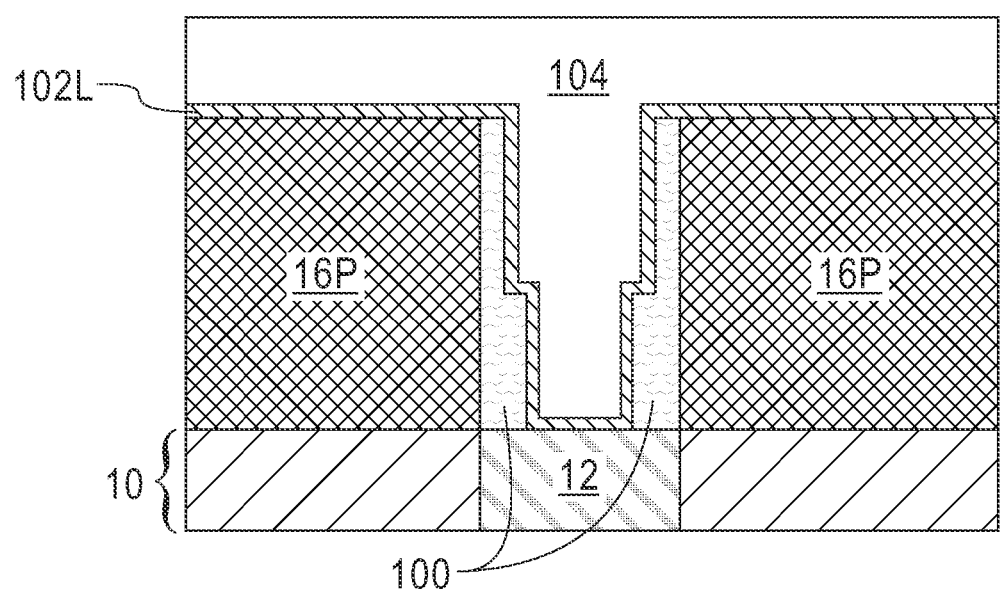
FIG. 26 is a cross sectional view of the exemplary semiconductor structure of FIG. 25 after forming a sacrificial material within a remaining volume of the via opening.

Referring now to FIG. 26, there is illustrated the exemplary semiconductor structure of FIG. 25 after forming a sacrificial material 104 within a remaining volume of the via opening 52. The sacrificial material may comprise any material such as, for example, amorphous carbon, or spun-on-glass, that has a different etch rate than the metal nitride layer 102L. The sacrificial material 104 can be formed utilizing any deposition process such as, for example, CVP, PECVD or spin-on coating.

Figure 27:
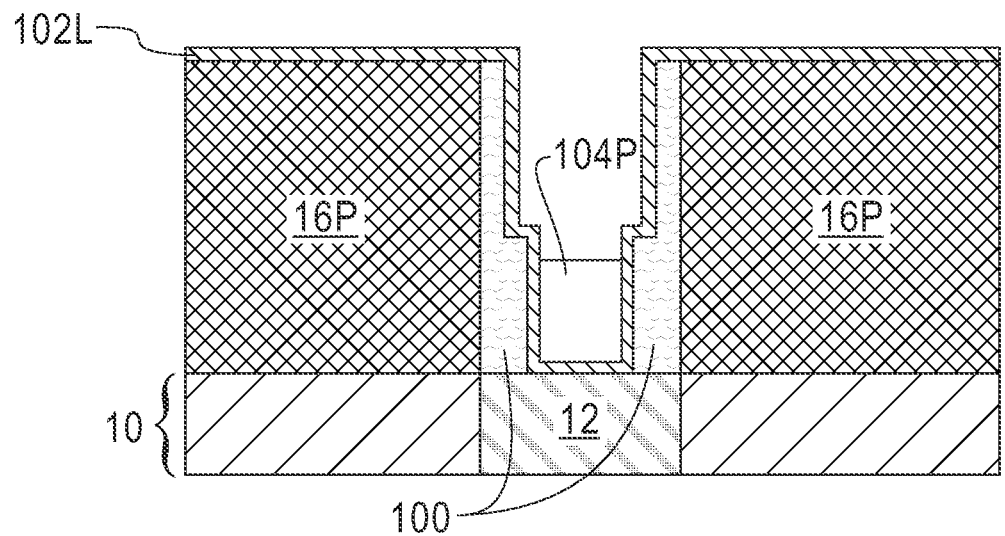
FIG. 27 is a cross sectional view of the exemplary semiconductor structure of FIG. 26 after removing an upper portion of the sacrificial material within the via opening.

Referring now to FIG. 27, there is illustrated the exemplary semiconductor structure of FIG. 26 after removing an upper portion of the sacrificial material 104 within the via opening 52. The sacrificial material that remains in the via opening 52 after this step is performed can be referred to herein as sacrificial material portion 104P. As is shown, the sacrificial material portion 104P is present at the bottom of the via opening 52 and protects a bottom portion of the metal nitride layer 102L. The removal of the upper portion of the sacrificial material 104 may be performed utilizing an etching process that is selective for recessing the sacrificial material 104, without removing the metal nitride layer 102L. In one embodiment, the etching process that is used to recess the sacrificial material 104 includes a $N_2/H_2$ plasma etch.

Figure 28:
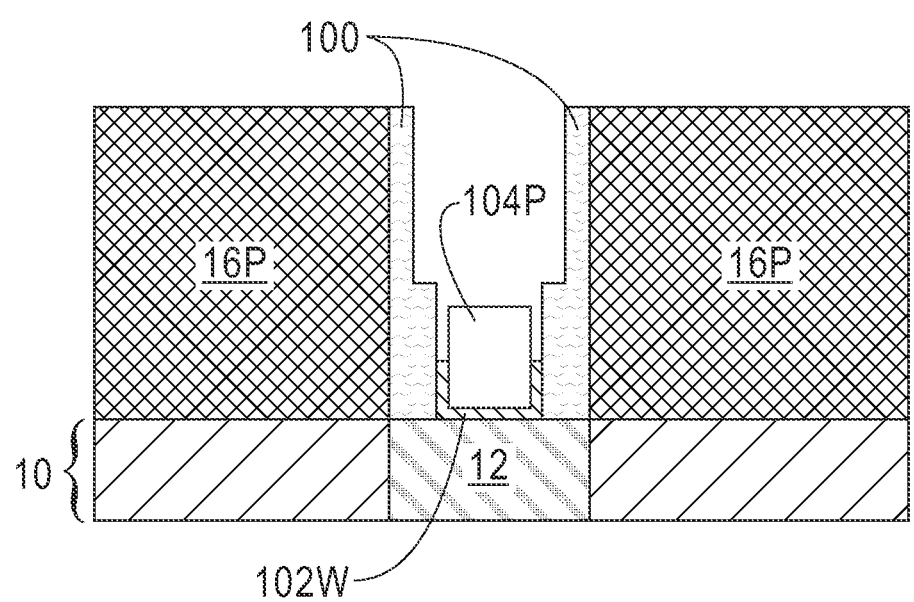
FIG. 28 is a cross sectional view of the exemplary semiconductor structure of FIG. 27 after recessing the metal nitride layer to provide a wrap around bottom electrode metal nitride contact.

Referring now to FIG. 28, there is illustrated the exemplary semiconductor structure of FIG. 27 after recessing the metal nitride layer 102L to provide a wrap around bottom electrode metal nitride contact 102W. In this embodiment, the sacrificial material portion 104P serves as an etch mask in forming the wrap around bottom electrode metal nitride contact 102W. As is shown, the wrap around bottom electrode metal nitride contact 102W is present at the bottom of the via opening 52 and is formed directly upon a surface of the bottom electrode 12 not covered by the keyhole forming material spacer 100.

The recessing of the metal nitride layer 102L that provides the wrap around bottom electrode metal nitride contact 102W can be performed utilizing an etch that is selective in removing metal nitride as compared to the sacrificial material and the material of the keyhole forming material spacer 100. In one example, the etch used to recess the metal nitride layer 102L and thus provide the wrap around bottom electrode metal nitride contact 102W may include a mixture of hydrogen peroxide and ammonium hydroxide. In one example, the mixture used to etch the metal nitride layer 102L includes a 5:1 mixture of hydrogen peroxide and ammonium hydroxide.

Figure 29:
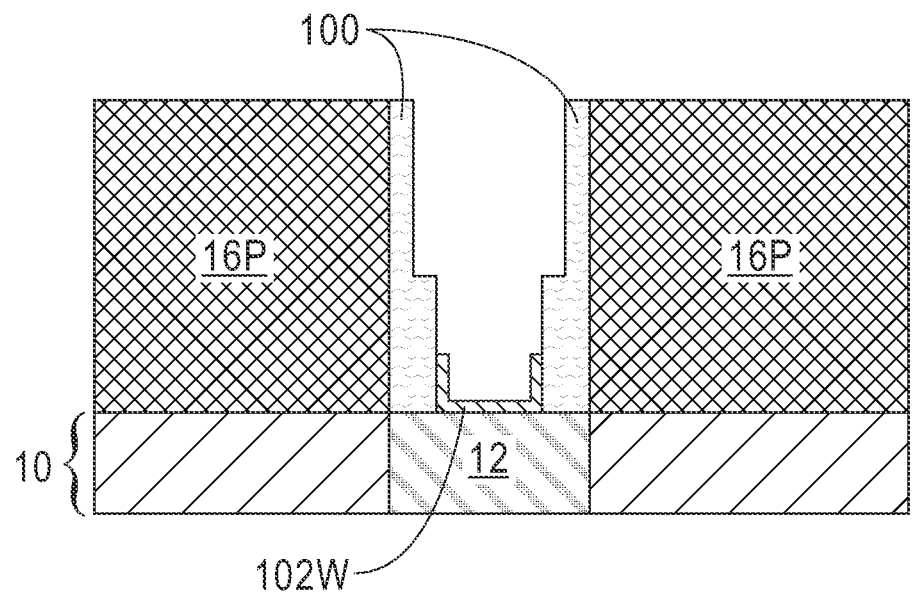
FIG. 29 is a cross sectional view of the exemplary semiconductor structure of FIG. 28 after removing remaining sacrificial material from within the via opening.

Referring now to FIG. 29, there is illustrated the exemplary semiconductor structure of FIG. 28 after removing remaining sacrificial material (i.e., sacrificial material portion 104P) from within the via opening 52. The sacrificial material portion 104P can be removed utilizing a recess etch as described above in recessing an upper portion of the sacrificial material 104. In one example, the etch process that is used to remove the sacrificial material portion 104P includes a $N_2/H_2$ plasma etch. As is shown, the wrap around bottom electrode metal nitride contact 102W is now completely exposed. The wrap around bottom electrode metal nitride contact 102W is U-shaped.

Figure 30:
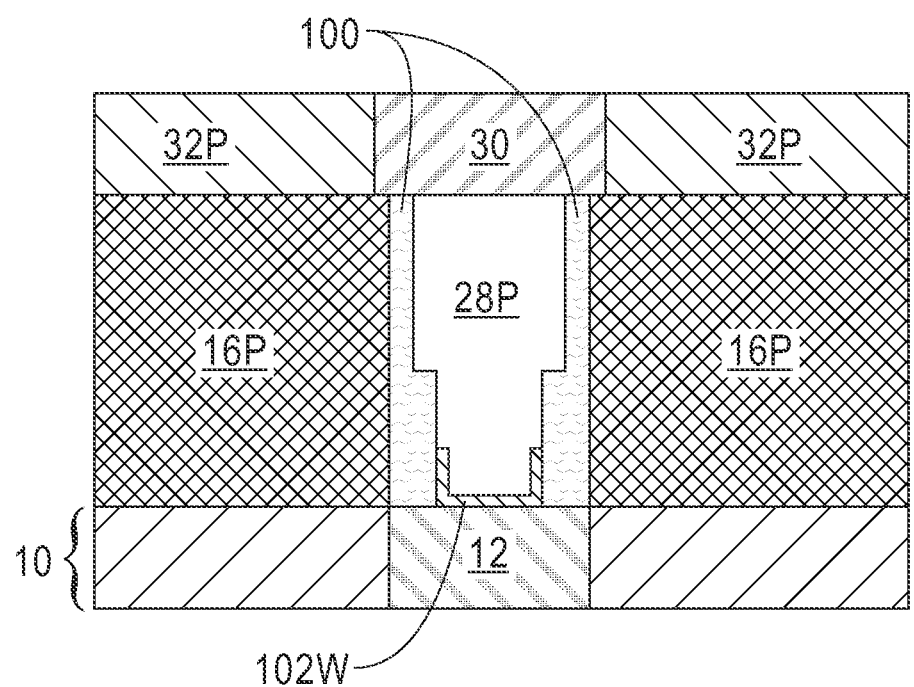
FIG. 30 is a cross sectional view of the exemplary semiconductor structure of FIG. 29 after formation of a phase change material structure and a top electrode.

Referring now to FIG. 30, there is illustrated the exemplary semiconductor structure of FIG. 29 after formation of a phase change material structure 28P and a top electrode 30. The phase change material structure 28P and the top electrode 30 that are used in this embodiment of the present application are the same as that described above in forming the structures shown in FIGS. 7-9A of the present application. In some embodiments, and as shown, the top electrode 30 is housed within a top insulating substrate 32P. The top insulating substrate 32P that is used in this embodiment of the present application is the same as that described above in providing the structure shown in FIG. 9A of the present application.

Figure 31A:
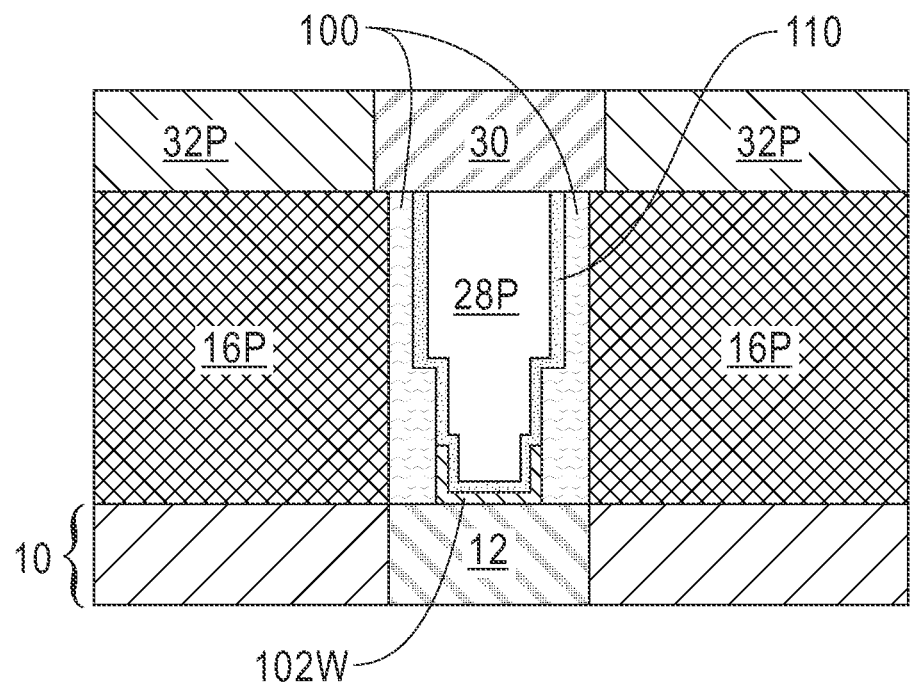
FIG. 31A is a cross sectional view of the exemplary semiconductor structure of FIG. 29 after forming a surfactant liner, a phase change material structure and a top electrode.

Referring now to FIG. 31A, there is illustrated the exemplary semiconductor structure of FIG. 29 after forming a surfactant liner 110, a phase change material structure 28P and a top electrode 30. The phase change material structure 28P and the top electrode 30 that are used in this embodiment of the present application are the same as that described above in forming the structures shown in FIGS. 7-9A of the present application. In some embodiments, and as shown, the top electrode 30 is housed within a top insulating substrate 32P. The top insulating substrate 32P that is used in this embodiment of the present application is the same as that described above in providing the structure shown in FIG. 9A of the present application.

The surfactant liner 110 is a contiguous liner that is formed within the structure of FIG. 29 prior to forming the phase change material structure 28P and the top electrode 30. The surfactant liner 110 is used to lower an interfacial force between the phase change material and the via surface. The surfactant liner 110 may comprise a material such as, for example, aluminum nitride, boron nitride, aluminum oxide, tantalum nitride, tungsten, tungsten nitride, cobalt tungsten, nickel tungsten and/or yttrium oxide. The surfactant liner 110 can be formed by a deposition process such as, for example, CVD, PECVD, or PVD. The surfactant liner 110 can have a thickness from 1 nm to 20 nm. Other thicknesses that are lesser than or greater than the aforementioned thickness range may also be employed as the thickness of the surfactant liner 110.

As is shown in this embodiment, the surfactant liner 110 is disposed between the phase change material structure 28P and the keyhole forming material spacer 110 and the wrap around bottom electrode metal nitride contact 102W.

Figure 31B:
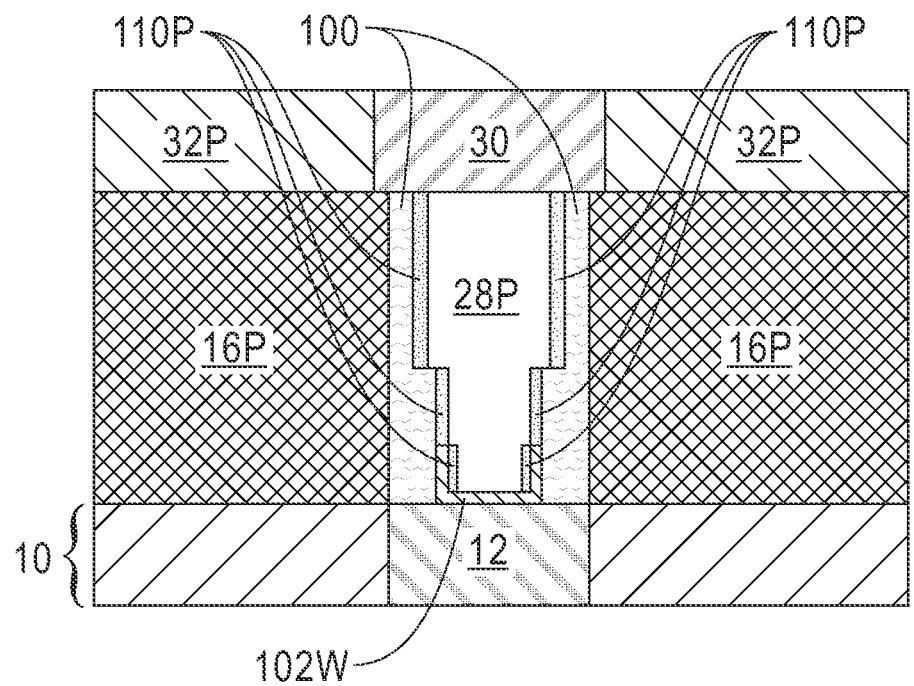
FIG. 31B is a cross sectional view of the exemplary semiconductor structure of FIG. 29 after forming a surfactant spacer, a phase change material and a top electrode.

Referring now to FIG. 31B, there is illustrated the exemplary semiconductor structure of FIG. 29 after forming a surfactant spacer 110P, a phase change material structure 28P and a top electrode 30. The phase change material structure 28P and the top electrode 30 that are used in this embodiment of the present application are the same as that described above in forming the structures shown in FIGS. 7-9A of the present application. In some embodiments, and as shown, the top electrode 30 is housed within a top insulating substrate 32P. The top insulating substrate 32P that is used in this embodiment of the present application is the same as that described above in providing the structure shown in FIG. 9A of the present application.

The surfactant spacer 110P includes one of the materials mentioned above for surfactant liner 110. The surfactant spacer 110P is formed by employing an anisotropic etch after surfactant layer deposition. In this embodiment, surfactant spacer 110P is present on vertical sidewall surfaces of the keyhole forming material spacer 100 and vertical sidewall surfaces of the wrap around bottom electrode metal nitride contact 102W. As such, portions of the phase change material structure 28P may come into direct contact with horizontal portions of the keyhole forming material spacer 100 and a horizontal portion of the wrap around bottom electrode metal nitride contact 102W.

Figure 32:
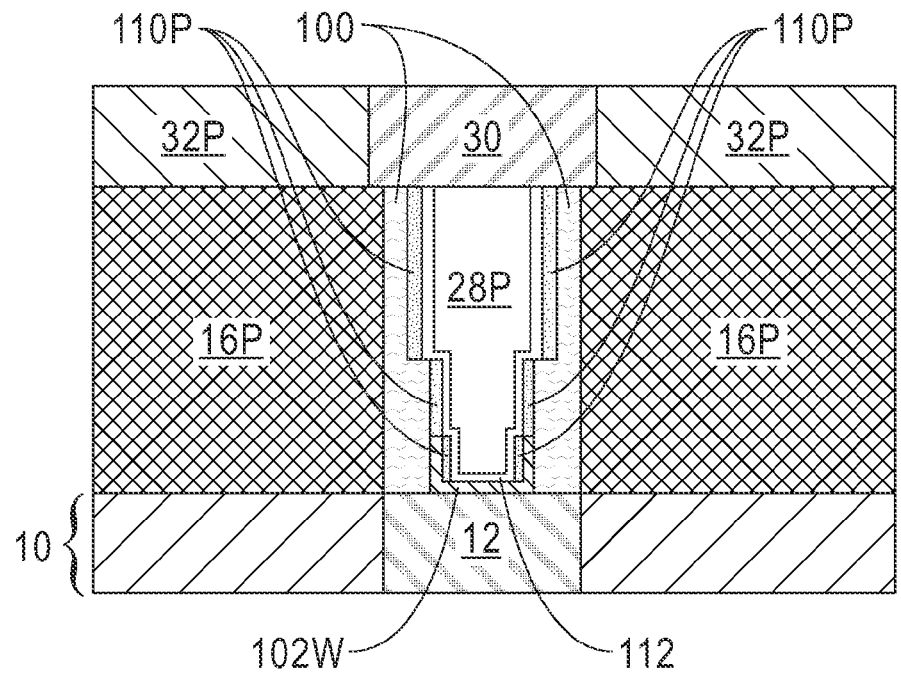
FIG. 32 is a cross sectional view of the exemplary semiconductor structure of FIG. 29 after formation of a surfactant spacer, a surfactant liner, a phase change material structure and a top electrode.

Referring now to FIG. 32, there is illustrated the exemplary semiconductor structure of FIG. 29 after formation of a surfactant spacer 110P, a surfactant liner 112, a phase change material structure 28P and a top electrode 30. The phase change material structure 28P and the top electrode 30 that are used in this embodiment of the present application are the same as that described above in forming the structures shown in FIGS. 7-9A of the present application. In some embodiments, and as shown, the top electrode 30 is housed within a top insulating substrate 32P. The top insulating substrate 32P that is used in this embodiment of the present application is the same as that described above in providing the structure shown in FIG. 9A of the present application.

The surfactant spacer 110P includes one of the materials mentioned above for surfactant liner 110. The surfactant spacer 110P is formed by employing an anisotropic etch after surfactant layer deposition. In this embodiment, surfactant spacer 110P is present on vertical sidewall surfaces of the keyhole forming material spacer 100 and vertical sidewall surfaces of the wrap around bottom electrode metal nitride contact 102W.

The surfactant liner 112 may also include one of the materials mentioned above for surfactant liner 110. The surfactant liner 112 is contiguously present in the via opening 52. In one embodiment, the surfactant liner 122 and the surfactant spacer 110P comprise a same surfactant material. In another embodiment, the surfactant liner 112 and the surfactant spacer 110P comprise a different surfactant material. The surfactant liner 112 can be formed by a deposition process and have a thickness as described above for surfactant layer 100.

Figure 33:
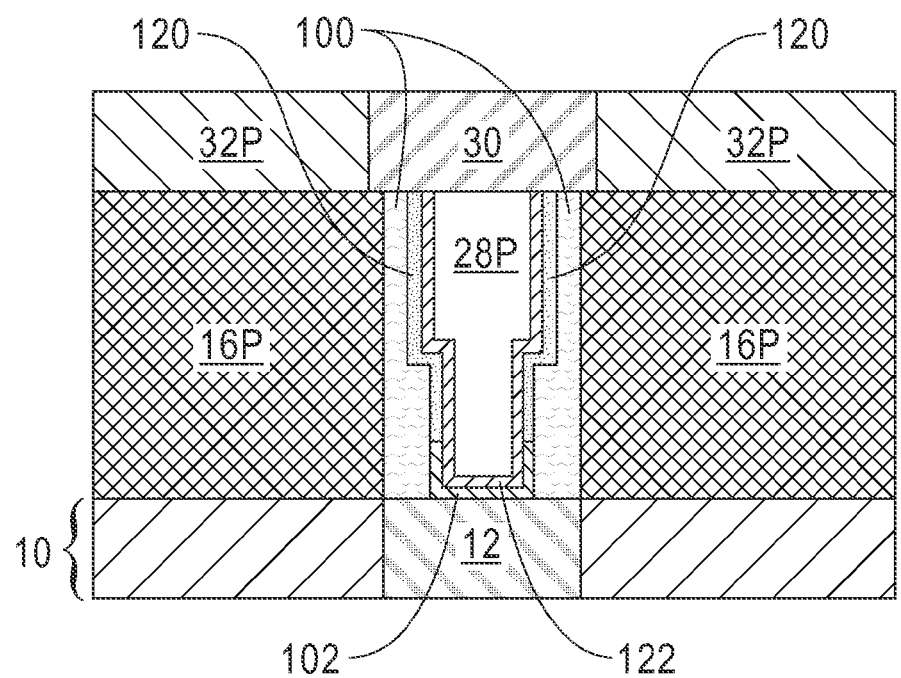
FIG. 33 is a cross sectional view of the exemplary semiconductor structure of FIG. 29 after formation of a surfactant spacer, a surfactant liner, a phase change material structure and a top electrode.

Referring now to FIG. 33, there is illustrated the exemplary semiconductor structure of FIG. 29 after formation of a surfactant spacer 120, a second surfactant liner 122, a phase change material structure 28P and a top electrode 30. The phase change material structure 28P and the top electrode 30 that are used in this embodiment of the present application are the same as that described above in forming the structures shown in FIGS. 7-9A of the present application. In some embodiments, and as shown, the top electrode 30 is housed within a top insulating substrate 32P. The top insulating substrate 32P that is used in this embodiment of the present application is the same as that described above in providing the structure shown in FIG. 9A of the present application.

The surfactant spacer 120 and the surfactant liner 122 that are used in this embodiment of the present application include one of the surfactant materials mentioned above for surfactant liner 102L. The surfactant spacer 120 is non-contiguous and is present only on sidewall surfaces of each keyhole forming material spacer 100 and a topmost surface of the wrap around bottom electrode metal nitride contact 102W. The surfactant liner 122 is contiguously present in the via opening 52. In one embodiment, the surfactant spacer 120 and the surfactant liner 122 comprise a same surfactant material. In another embodiment, the surfactant spacer 120 and the surfactant liner 122 comprise a different surfactant material. The surfactant spacer 120 can be formed utilizing the processing steps illustrated in FIGS. 37-40 of the present application.

Figure 34:
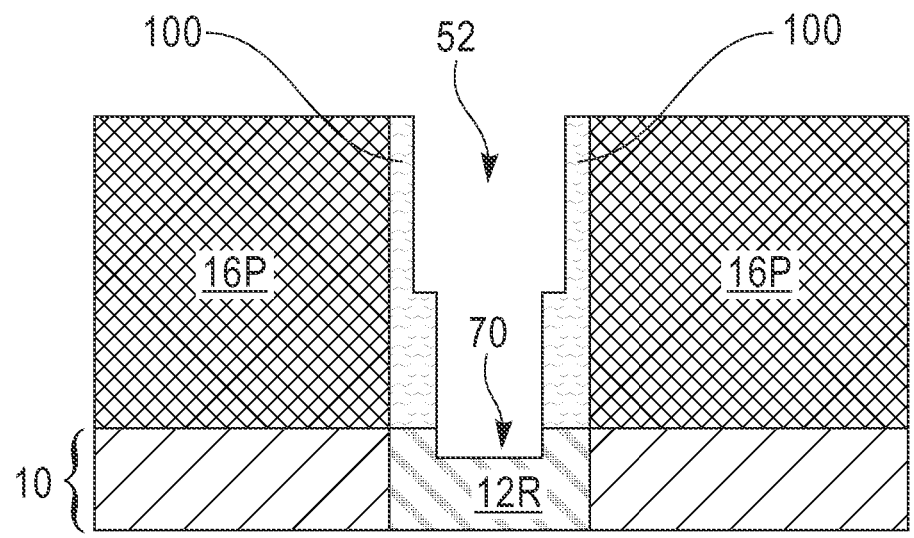
FIG. 34 is a cross sectional view of the exemplary semiconductor structure FIG. 24 after recessing an upper portion of the bottom electrode.

Referring now to FIG. 34, there is illustrated the exemplary semiconductor structure FIG. 24 after recessing an upper portion of the bottom electrode 12. The recessing of the upper portion of the bottom electrode 12 employs each keyhole forming material spacer 100 as an etch mask. The recessing may include an etch that is selective in removing the conductive metallic material that provides the bottom electrode 12. Element 70 denotes a recessed region that is formed within the bottom electrode 12. The recessed bottom electrode is labeled as 12R in the drawing.

Figure 35:
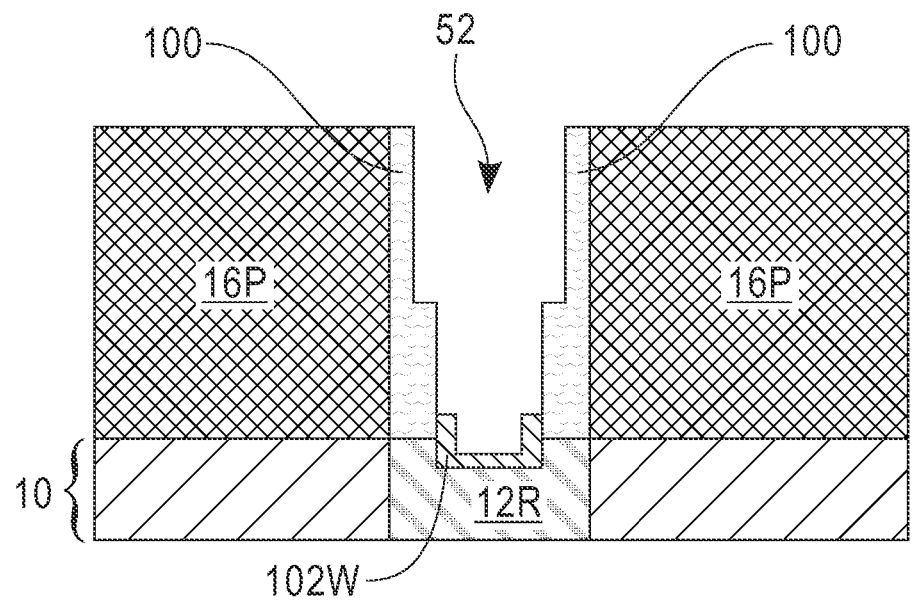
FIG. 35 is a cross sectional of the exemplary semiconductor structure of FIG. 34 after forming a warp around bottom electrode metal nitride contact.

Referring now to FIG. 35, there is illustrated the exemplary semiconductor structure of FIG. 34 after forming a warp around bottom electrode metal nitride contact 102W within the bottom of the via opening and within a portion of the recessed region 70. The around bottom electrode metal nitride contact 102W can be formed and include materials as described above in FIGS. 25-29 of the present application.

Figure 36:
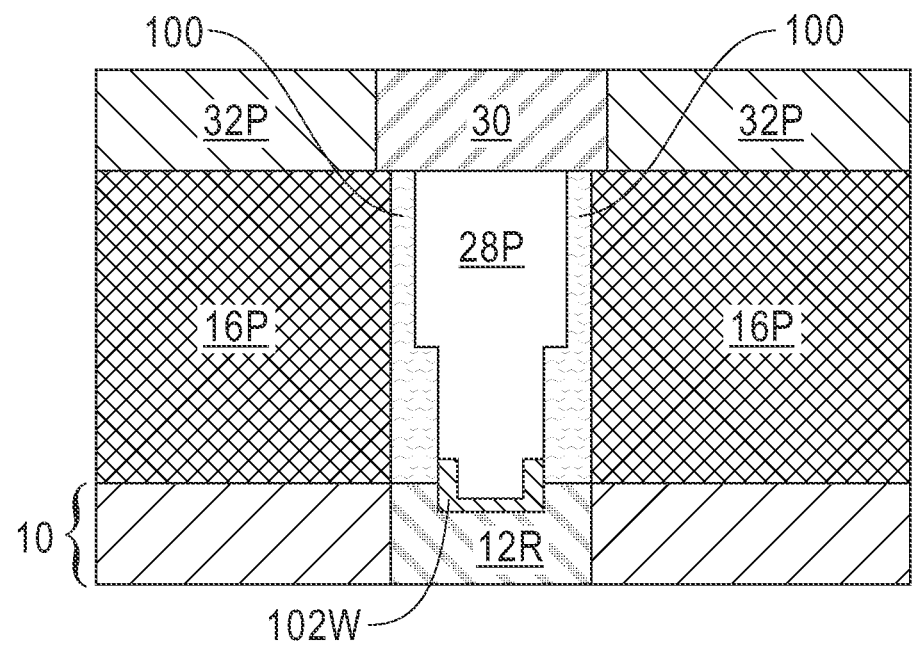
FIG. 36 is a cross sectional view of the exemplary semiconductor structure of FIG. 35 after formation of a phase change memory structure and a top electrode.

Referring now to FIG. 36, there is illustrated the exemplary semiconductor structure of FIG. 35 after formation of a phase change memory structure 28P and a top electrode 30. The phase change material structure 28P and the top electrode 30 that are used in this embodiment of the present application are the same as that described above in forming the structures shown in FIGS. 7-9A of the present application. In some embodiments, and as shown, the top electrode 30 is housed within a top insulating substrate 32P. The top insulating substrate 32P that is used in this embodiment of the present application is the same as that described above in providing the structure shown in FIG. 9A of the present application.

Figure 37:
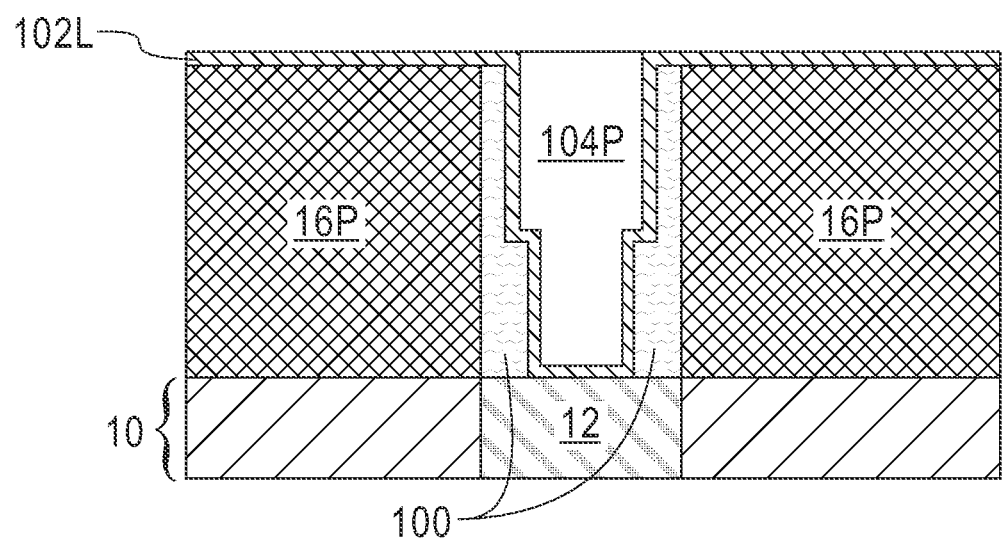
FIG. 37 is a cross sectional view of the exemplary semiconductor structure of FIG. 26 after performing a planarization process.

Referring now to FIG. 37, there is illustrated the exemplary semiconductor structure of FIG. 26 after performing a planarization process. The planarization process may include one of CMP and grinding and it stops on a topmost horizontal surface of metal nitride layer 102L. As such, and at this point of the process, the sacrificial material portion 104P has a topmost surface that is coplanar with a topmost surface of the metal nitride layer 102L.

Figure 38:
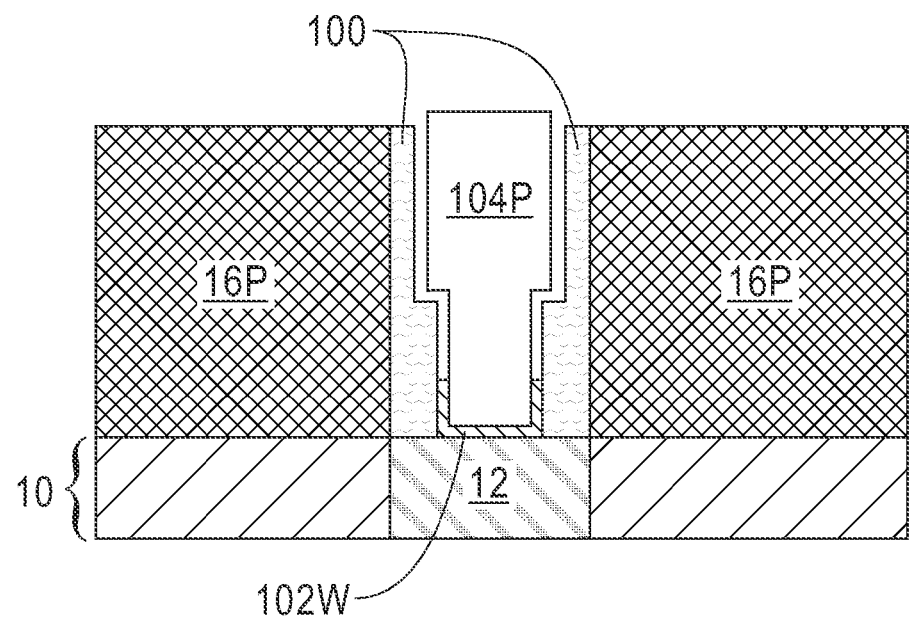
FIG. 38 is a cross sectional view of the exemplary semiconductor structure of FIG. 37 after recessing the metal nitride layer to provide a wrap around bottom electrode metal nitride contact.

Referring now to FIG. 38, there is illustrated the exemplary semiconductor structure of FIG. 37 after recessing the metal nitride layer 102L to provide a wrap around bottom electrode metal nitride contact 102W. In this embodiment, the sacrificial material portion 104P serves as an etch mask in forming the wrap around bottom electrode metal nitride contact 102W. As is shown, the wrap around bottom electrode metal nitride contact 102W is present at the bottom of the via opening 52 and is formed directly upon a surface of the bottom electrode 12 not covered by the keyhole forming material spacer 100.

The recessing of the metal nitride layer 102L that provides the wrap around bottom electrode metal nitride contact 102W can be performed utilizing an etch that is selective in removing metal nitride as compared to the sacrificial material and the material of the keyhole forming material spacer 100. In one example, the etch used to recess the metal nitride layer 102L and thus provide the wrap around bottom electrode metal nitride contact 102W may include a mixture of hydrogen peroxide and ammonium hydroxide. In one example, the mixture used to etch the metal nitride layer 102L includes a 5:1 mixture of hydrogen peroxide and ammonium hydroxide.

Figure 39:
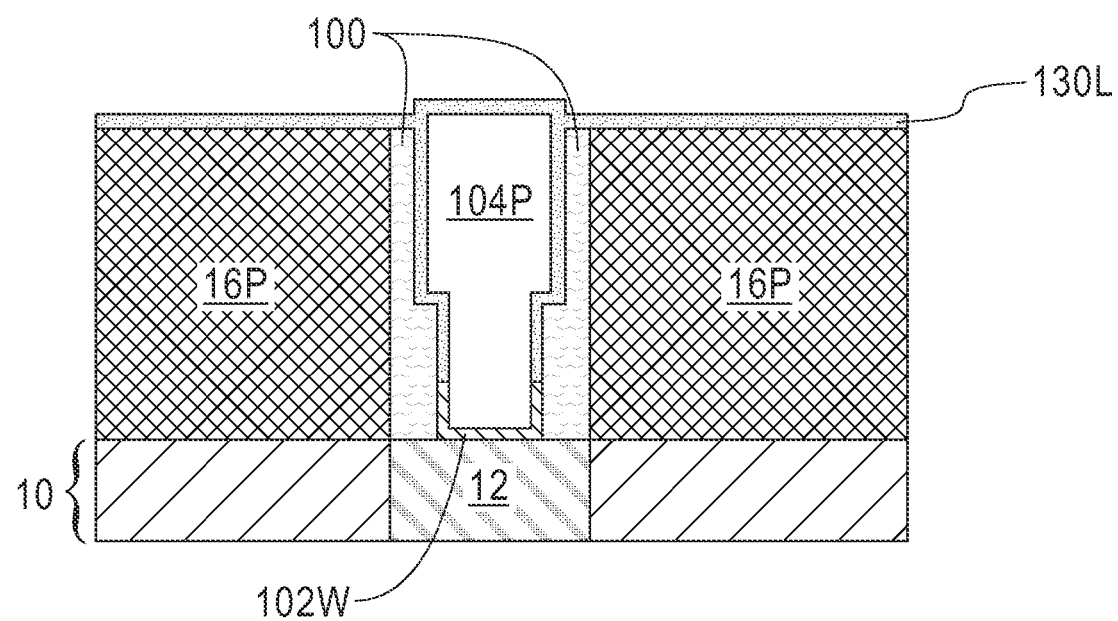
FIG. 39 is a cross sectional view of the exemplary semiconductor structure of FIG. 38 after forming a surfactant layer.

Referring now to FIG. 39, there is illustrated the exemplary semiconductor structure of FIG. 38 after forming a surfactant layer 130L. The surfactant layer 130L is used to lower an interfacial force between the phase change material and the via surface. The surfactant layer 130L may comprise a material such as, for example, aluminum nitride, boron nitride, aluminum oxide, tantalum nitride, tungsten, tungsten nitride, cobalt tungsten, nickel tungsten and/or yttrium oxide. The surfactant layer 130L can be formed by a deposition process such as, for example, CVD, PECVD, or PVD. The surfactant layer 130L can have a thickness from 1 nm to 20 nm. Other thicknesses that are lesser than or greater than the aforementioned thickness range may also be employed as the thickness of the surfactant layer 130L.

As is shown, the surfactant layer 130L is formed on the horizontal surfaces of each first dielectric material 16P and on the topmost surface of the sacrificial material portion 104P. Also, the surfactant layer 10 fills in the gaps between sidewall surfaces of the sacrificial material portion 104P and each of the keyhole forming material spacers 100.

Figure 40:
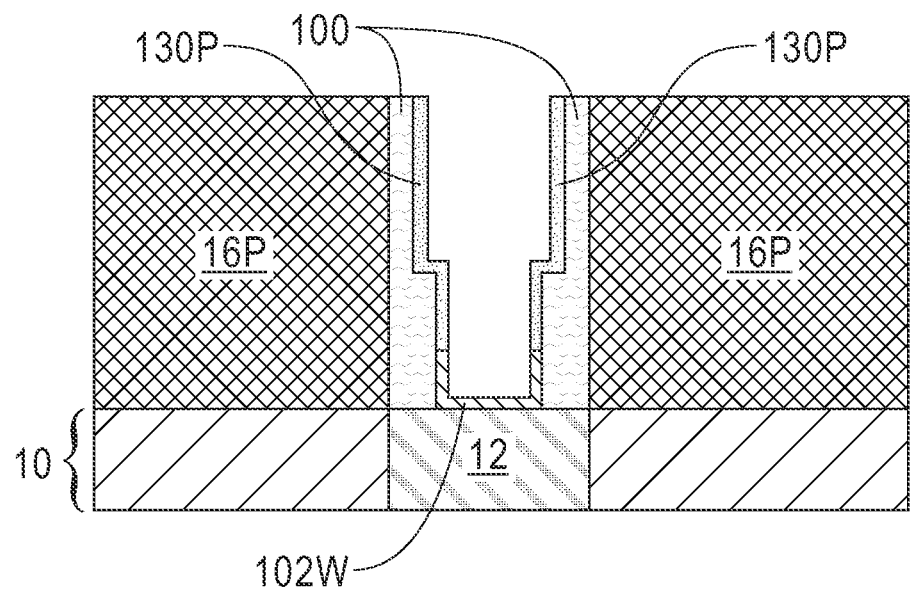
FIG. 40 is a cross sectional view of the exemplary semiconductor structure of FIG. 39 after planarization and removing a remaining portion of the sacrificial material.

Referring now to FIG. 40, there is illustrated the exemplary semiconductor structure of FIG. 39 after planarization and removing a remaining portion of the sacrificial material (i.e., sacrificial material portion 104P). The planarization step, which includes CMP and/or grinding, removes any surfactant layer 130L and any sacrificial material portion 104P that is present outside of the via opening 52.

The removal of the remaining sacrificial material portion 104P may be performed utilizing an etching process that is selective for recessing the sacrificial material portion 104P, without removing the metal nitride layer 102L. In one embodiment, the etching process that is used to recess the sacrificial material 104 includes a $N_2/H_2$ plasma etch. As is shown, the wrap around bottom electrode metal nitride contact 102W is now completely exposed. The wrap around bottom electrode metal nitride contact 102W is U-shaped. As is also shown, a portion of surfactant layer 130L remains within the via opening and is located on sidewall surfaces of each keyhole forming material spacer 100. The remaining portion of surfactant layer 130L can be referred to herein as surfactant spacer 130P.

Figure 41:
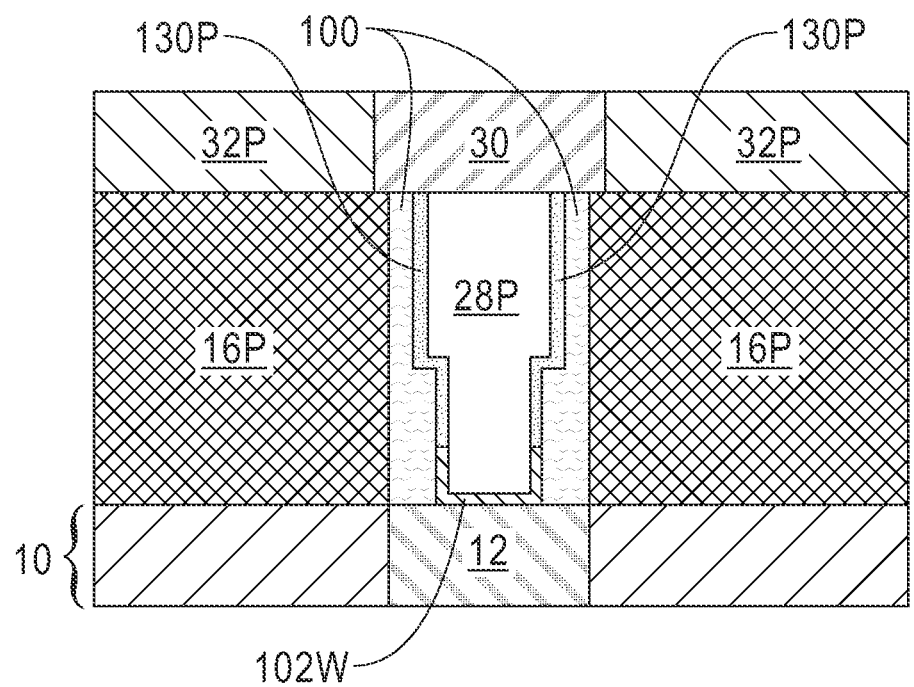
FIG. 41 is a cross sectional view of the exemplary semiconductor structure of FIG. 40 after formation of a phase change material structure and a top electrode.

Referring now to FIG. 41, there is illustrated the exemplary semiconductor structure of FIG. 40 after formation of a phase change material structure 28P and a top electrode 30.

The phase change material structure 28P and the top electrode 30 that are used in this embodiment of the present application are the same as that described above in forming the structures shown in FIGS. 7-9A of the present application. In some embodiments, and as shown, the top electrode 30 is housed within a top insulating substrate 32P. The top insulating substrate 32P that is used in this embodiment of the present application is the same as that described above in providing the structure shown in FIG. 9A of the present application.

FIGS. 42-47 illustrate an embodiment of the present application in which the total thickness of the surfactant liner at the bottom of the via opening 52 is reduced. Reducing the thickness of the surfactant liner at the bottom of the via opening reduces the resistance of the non-volatile memory cell.

Figure 42:
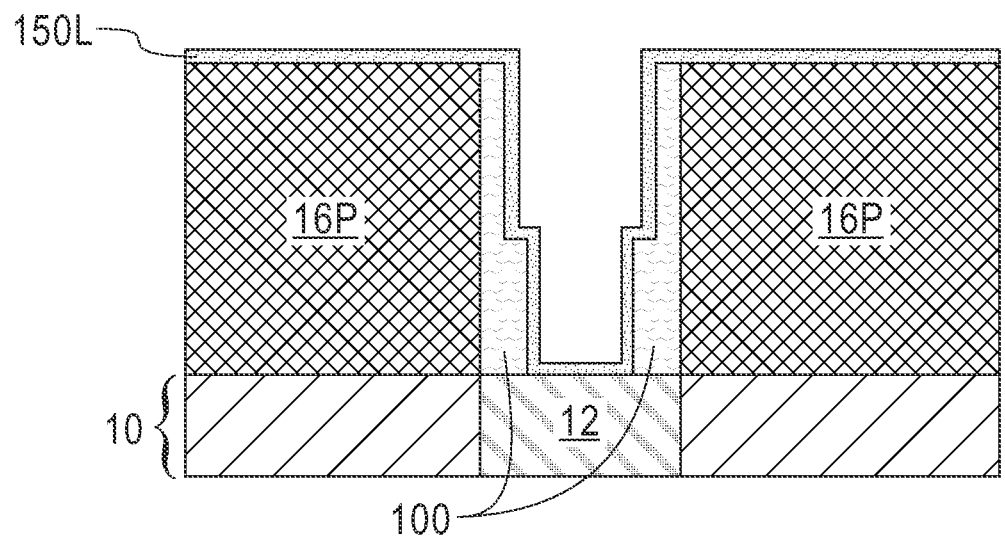
FIG. 42 is a cross sectional view of the exemplary semiconductor structure of FIG. 26 after formation of a first surfactant layer.

Referring first to FIG. 42, there is illustrated the exemplary semiconductor structure of FIG. 26 after formation of a first surfactant layer 150L. The surfactant layer 150L is used to lower an interfacial force between the phase change material and the via surface. The first surfactant layer 150L may comprise a material such as, for example, aluminum nitride, boron nitride, aluminum oxide, tantalum nitride, tungsten, tungsten nitride, cobalt tungsten, nickel tungsten and/or yttrium oxide. The first surfactant layer 150L is a contiguous layer that can be formed by a deposition process such as, for example, CVD, PECVD, or PVD. The surfactant layer 130L can have a thickness from 1 nm to 20 nm. Other thicknesses that are lesser than or greater than the aforementioned thickness range may also be employed as the thickness of the first surfactant layer 150L.

Figure 43:
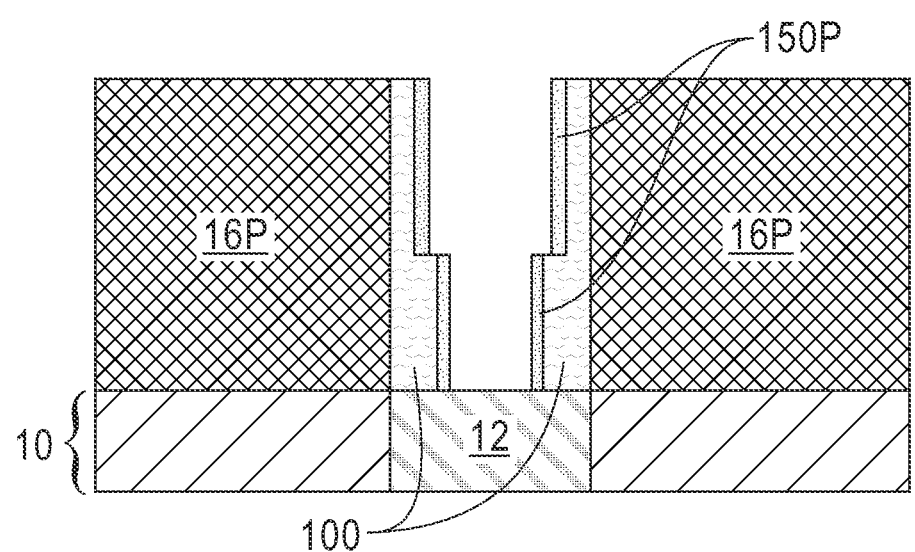
FIG. 43 is a cross sectional view of the exemplary semiconductor structure of FIG. 42 after removing all horizontal portions of the first surfactant layer.

Referring now to FIG. 43, there is illustrated the exemplary semiconductor structure of FIG. 42 after removing all horizontal portions of the first surfactant layer 150L to provide surfactant spacers 150P on the exposed sidewall surfaces of each keyhole forming material spacer 100. An anisotropic etch can be used to provide the surfactant spacers 150P.

Figure 44:
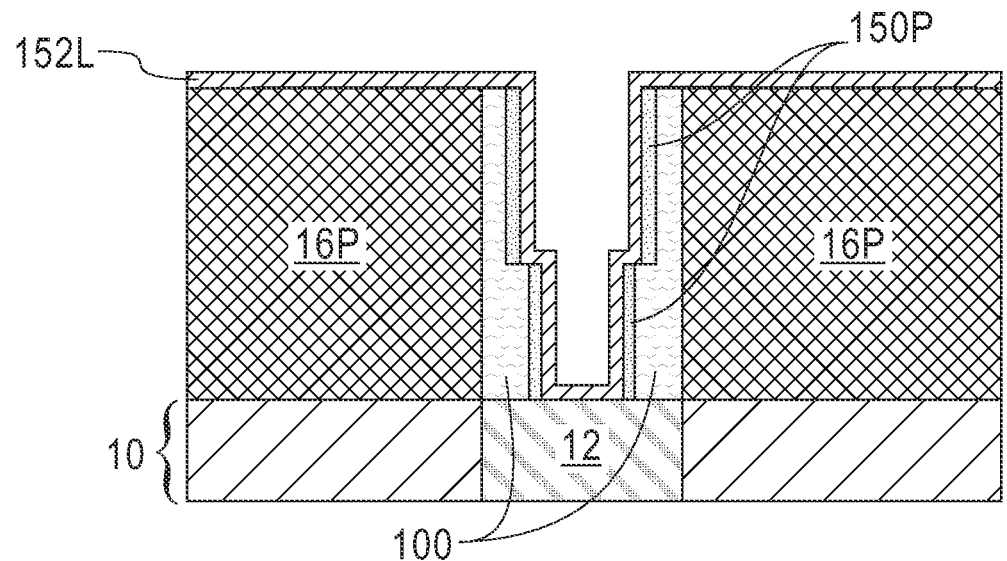
FIG. 44 is a cross sectional view of the exemplary semiconductor structure of FIG. 43 after formation of a second surfactant layer.

Referring now to FIG. 44, there is illustrated the exemplary semiconductor structure of FIG. 43 after formation of a second surfactant layer 152L. The second surfactant layer 152L is contiguous layer that is present on all exposed surfaces of the structure shown in FIG. 43. The second surfactant layer 152L may include one of the materials mentioned above for the first surfactant layer 150L. In one embodiment, the first surfactant layer 150L and the second surfactant layer 152L comprise a same surfactant material. In another embodiment, the first surfactant layer 150L and the second surfactant layer 152L comprise a different surfactant material. The second surfactant layer 152L can be formed utilizing one of the deposition processes mentioned above in forming the first surfactant layer 150L. The thickness of the second surfactant layer 152L is within the range mentioned above for the first surfactant layer 150L.

Figure 45:
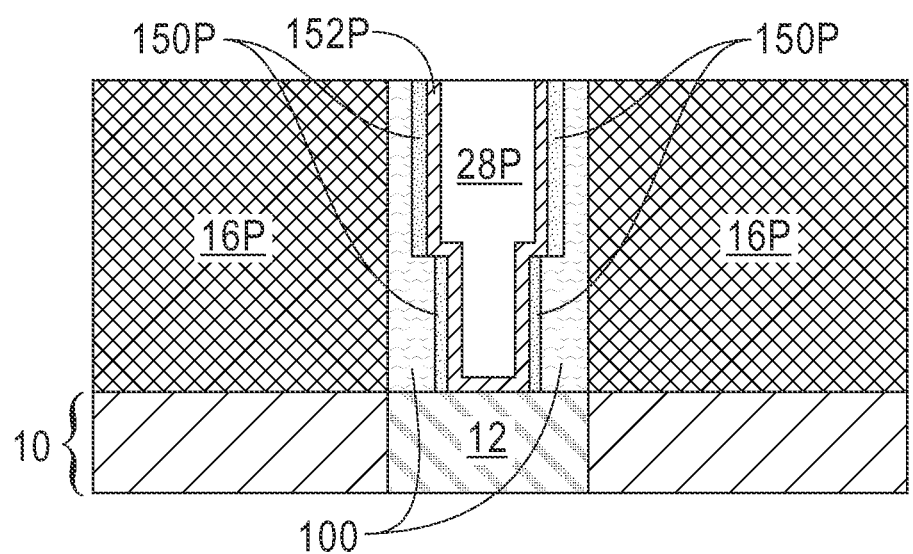
FIG. 45 is a cross sectional view of the exemplary semiconductor structure of FIG. 44 after forming a phase change material structure within a remaining volume of the via opening.

Referring now to FIG. 45, there is illustrated the exemplary semiconductor structure of FIG. 44 after forming a phase change material structure 28P within a remaining volume of the via opening 52. The phase change material structure 28P can include one of the phase change materials mentioned above in forming the phase change memory structure 28P shown in FIGS. 7-8 of the present application. The phase change material structure 28P can be formed by deposition of a phase change material (as previously described in forming the structure shown in FIG. 7) and then planarizing the structure by CMP and/or grinding. During planarization, the second surfactant layer 150L that is present outside the via opening and on the topmost surface of each first dielectric material portion 16P is removed providing surfactant liner 152P within the via opening.

Figure 46:
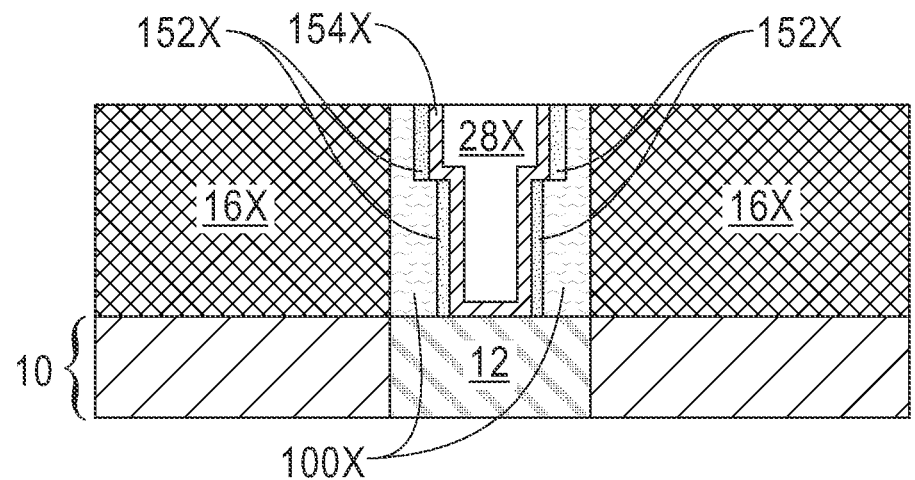
FIG. 46 is a cross sectional view of the exemplary semiconductor structure of FIG. 45 after performing an optional planarization process.

Referring now to FIG. 46, there is illustrated the exemplary semiconductor structure of FIG. 45 after performing an optional planarization process. This planarization process reduces the vertical height of each first dielectric portion 16P, each surfactant spacer 150P, each keyhole forming material spacer 100 and the surfactant liner 152P. Each reduced height first dielectric portion is labeled as 16X, each reduced height surfactant spacer is labeled as 150X, each reduced height each keyhole forming material spacer is labeled 100X, and the reduced height surfactant liner is labeled as 154X.

Figure 47:
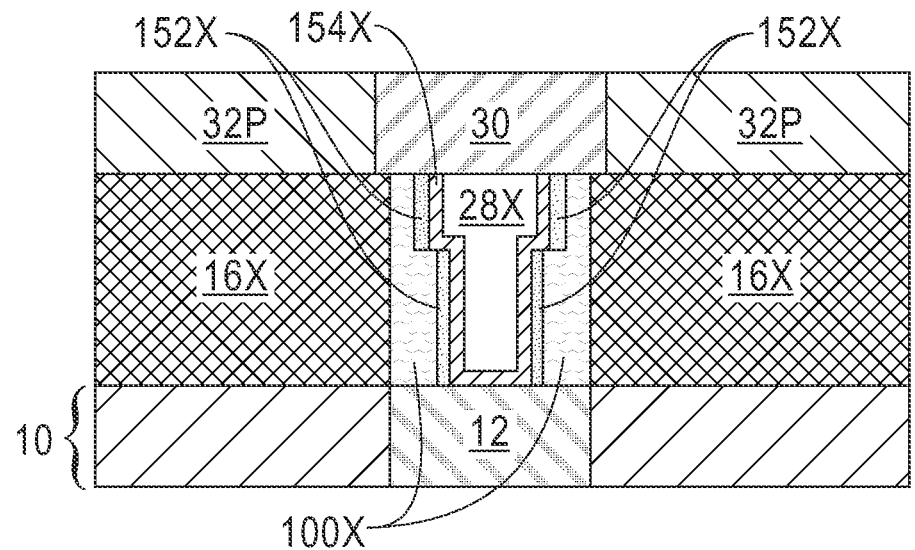
FIG. 47 is a cross sectional view of the exemplary semiconductor structure of FIG. 46 after formation of a top electrode on a topmost surface of the phase change material structure.

Referring now to FIG. 47, there is illustrated the exemplary semiconductor structure of FIG. 46 after formation of a top electrode 30 on a topmost surface of the phase change material structure 28X or 28P. The top electrode 30 that is used in this embodiment of the present application is the same as that described above in forming the top electrode for the structure shown in FIG. 9A of the present application. In some embodiments, and as shown, the top electrode 30 is housed within a top insulating substrate 32P. The top insulating substrate 32P that is used in this embodiment of the present application is the same as that described above in providing the structure shown in FIG. 9A of the present application.

It is should be noted that in any of the various embodiments of the present application, it is possible to utilize any of the various variations described and illustrated above. In some embodiments of the present application, the final phase change material structure that is provided has an aspect ratio (width to height) of from 1:1 up to 1:10. In one example, the aspect ratio of t the final phase change material structure is about 1:3.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A non-volatile memory device comprising:
   a bottom electrode embedded in an insulating substrate, said bottom electrode having a topmost surface that is coplanar with a topmost surface of said insulating substrate;
   a layer of dielectric material having a plurality of sidewall surfaces located within a via opening, said layer of dielectric material is located above said bottom electrode and said insulating substrate;
   a metal nitride spacer located along a bottom portion of each sidewall surface of said layer of dielectric material and in said via opening, said metal nitride spacer having a bottommost surface that present directly on a portion of said topmost surface of said bottom electrode, and a height that is less than a height of said dielectric layer;
   a phase change material structure present within said via opening and contacting at least a sidewall surface of said nitride spacer, said phase change material structure having a bottommost surface that is present directly on a remaining portion of said topmost surface of said bottom electrode; and a top electrode located on a topmost surface of said phase change material structure.

2. The non-volatile memory device of claim 1, wherein said phase change material structure contacts a top portion of each sidewall surface of said layer of dielectric material and a topmost surface of of said metal nitride spacer.

3. The non-volatile memory device of claim 1, wherein said phase change material is enclosed by said bottom electrode, said top electrode and said metal nitride spacer.

4. The non-volatile memory device of claim 1, wherein said bottommost surface of said phase change material structure is coplanar with said bottommost surface of said metal nitride spacer.

5. The non-volatile memory device of claim 1, wherein said metal nitride spacer comprises a compound M-X—N wherein M is Ti or Ta, and X is Al or Si.

6. The non-volatile memory device of claim 1, wherein said phase change memory material structure comprises a chalcogenide.

7. The non-volatile memory device of claim 1, wherein one sidewall surface of said metal nitride layer extends beyond a vertical edge of said bottom electrode and a portion of said bottommost surface of said metal nitride spacer directly contacts said topmost surface of said insulating substrate.

8. The non-volatile memory device of claim 1, wherein one sidewall surface of said metal nitride spacer is vertically coincident to a vertical edge of said bottom electrode and an entirety of said bottommost surface of said metal nitride spacer directly contacts an exposed portion of said topmost surface of said bottom electrode.

9. The non-volatile memory device of claim 1, wherein a topmost surface of said metal nitride spacer is coplanar with said topmost surface of said phase change material structure.

10. The non-volatile memory device of claim 9, wherein a topmost surface of said top electrode is coplanar with a topmost surface of said layer of dielectric material.

* * * * *